(12) United States Patent
Hung et al.

(10) Patent No.: US 12,745,583 B2
(45) **Date of Patent: *Sep. 22, 2026**

(54) SEMICONDUCTOR DEVICES AND METHODS OF MANUFACTURE

(71) Applicant: Taiwan Semiconductor Manufacturing Co., Ltd., Hsinchu (TW)

(72) Inventors: Chia-Yang Hung, Kaohsiung City (TW); Huan-Just Lin, Hsinchu (TW); Sheng-Liang Pan, Hsinchu (TW); Yungtzu Chen, Hsinchu (TW); Po-Chuan Wang, Taipei City (TW); Guan-Xuan Chen, Taoyuan City (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 119 days.

This patent is subject to a terminal disclaimer.

(21) Appl. No.: 18/790,002

(22) Filed: Jul. 31, 2024

(65) Prior Publication Data

US 2024/0395536 A1 Nov. 28, 2024

Related U.S. Application Data

(63) Continuation of application No. 17/720,033, filed on Apr. 13, 2022, now Pat. No. 12,154,784.

(60) Provisional application No. 63/286,625, filed on Dec. 7, 2021.

(51) Int. Cl.

| | |
|---|---|
| ***H10P 70/00*** | (2026.01) |
| ***H10D 84/01*** | (2025.01) |
| ***H10D 84/03*** | (2025.01) |
| ***H10P 14/60*** | (2026.01) |

(52) U.S. Cl.

CPC ........... *H10P 70/15* (2026.01); *H10D 84/013* (2025.01); *H10D 84/0158* (2025.01); *H10D 84/038* (2025.01); *H10P 14/6514* (2026.01)

(58) Field of Classification Search

None

See application file for complete search history.

(56) References Cited

U.S. PATENT DOCUMENTS

| | | | |
|---|---|---|---|
| 4,717,448 | A | 1/1988 | Cox |
| 6,028,015 | A | 2/2000 | Wang |
| 9,761,488 | B2 | 9/2017 | Cheng et al. |

(Continued)

FOREIGN PATENT DOCUMENTS

| | | | |
|---|---|---|---|
| EP | 1041614 | B1 | 8/2004 |
| TW | I596703 | B | 8/2017 |

*Primary Examiner* — Shamim Ahmed

(74) *Attorney, Agent, or Firm* — Slater Matsil, LLP

(57) ABSTRACT

Semiconductor devices and methods of manufacturing the semiconductor devices are described herein. A method includes forming a first opening through a dielectric layer, the first opening exposing a conductive region. A wet cleaning is used after the forming the first opening, and the first opening is treated after the wet cleaning the first opening, the treating the first opening comprising turning a sidewall treatment precursor and a bottom treatment precursor into a first plasma mixture, the sidewall treatment precursor being different from the bottom treatment precursor. The first opening is filled with a conductive material after the treating the first opening.

20 Claims, 22 Drawing Sheets

(56) References Cited

U.S. PATENT DOCUMENTS

| | | | | |
|---|---|---|---|---|
| 12,154,784 | B2 * | 11/2024 | Hung | H10P 70/15 |
| 2006/0046472 | A1 | 3/2006 | Sandhu | |
| 2006/0226559 | A1 | 10/2006 | Mehrotra | |
| 2009/0215658 | A1 | 8/2009 | Minsek | |
| 2010/0261349 | A1 | 10/2010 | Van Schravendijk | |
| 2011/0195559 | A1 | 8/2011 | Chen | |
| 2016/0111371 | A1 | 4/2016 | Peng | |
| 2017/0092590 | A1 | 3/2017 | Spooner | |
| 2019/0214296 | A1 * | 7/2019 | Wang | H10W 20/081 |

* cited by examiner

SEMICONDUCTOR DEVICES AND METHODS OF MANUFACTURE

PRIORITY CLAIM AND CROSS-REFERENCE

This application is a continuation of U.S. patent application Ser. No. 17/720,033, filed on Apr. 13, 2022, now U.S. Pat. No. 12,154,784 entitled "Semiconductor Devices and Methods of Manufacture," which claims the benefit of U.S. Provisional Application No. 63/286,625, filed on Dec. 7, 2021, which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
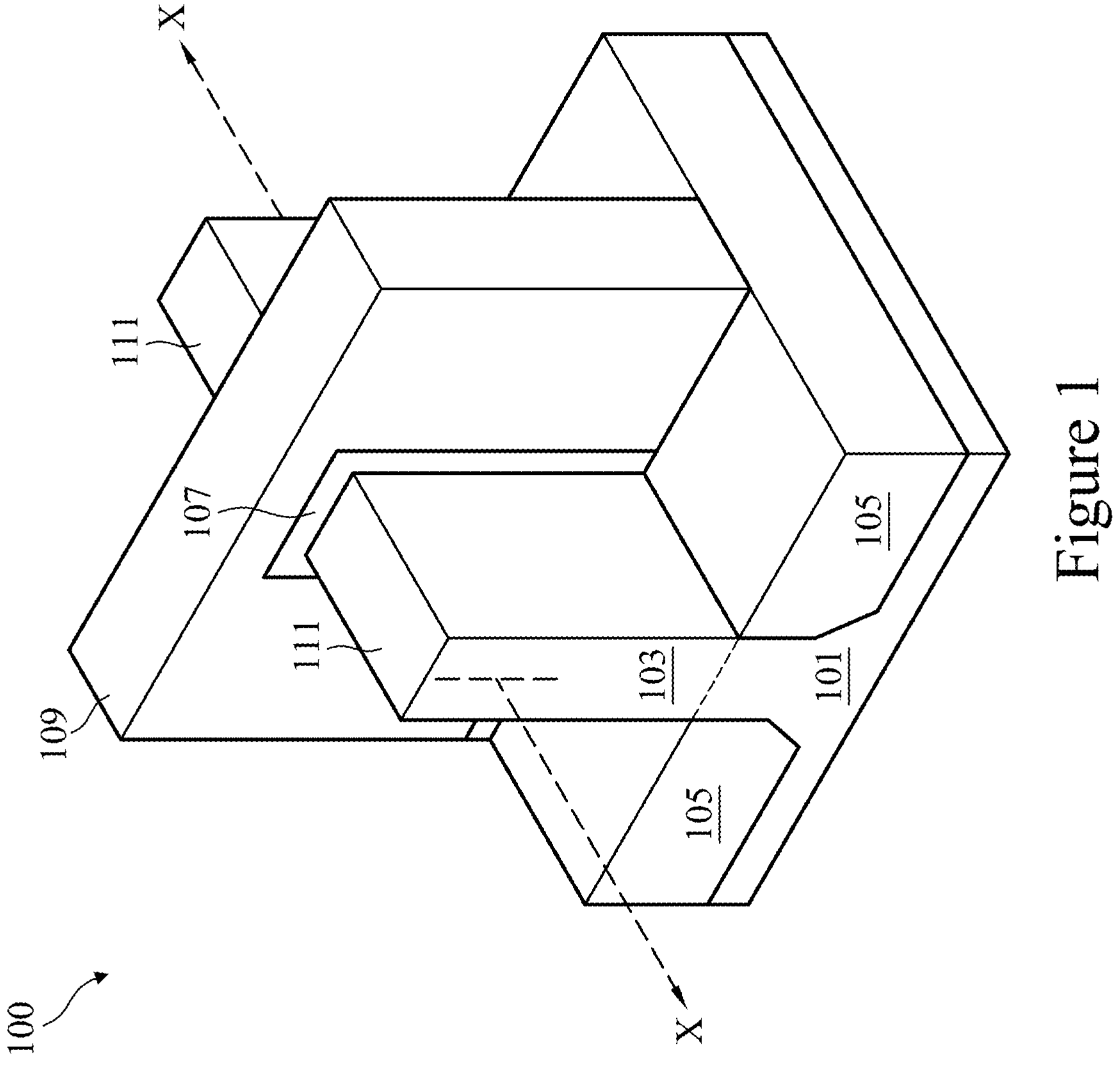
FIG. 1 illustrates the formation of fins, isolation regions, dummy dielectric and a dummy gate, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

This disclosure relates to a semiconductor device and its manufacturing method, and more particularly to a semiconductor device comprising a contact to a conductive region. Embodiments discussed herein, however, are intended to be illustrative embodiments, and are not intended to limit the embodiments to those specifically discussed. For example, embodiments disclosed herein are directed towards the formation of a plurality of fin-type field effects transistors (finFETs) within a wafer at the 5 nm technology node, but the ideas presented may be implemented in a wide variety of devices and other nodes, such as 3 nm, 2 nm, 3P nm, and beyond.

FIG. 1 illustrates a three-dimensional view of an intermediate structure 100 formed during the formation of a finFET device, in accordance with some embodiments. The intermediate structure 100 comprises a fin 103 on a substrate 101 (e.g., a semiconductor substrate). Isolation regions 105 are disposed in the substrate 101, and the fin 103 protrudes above and from between neighboring isolation regions 105. Although the isolation regions 105 are described and/or illustrated as being separate from the substrate 101, as used herein the term "substrate" may be used to refer to just a semiconductor substrate or a semiconductor substrate inclusive of the isolation regions 105. Additionally, although the fin 103 is illustrated as a single, continuous material as the substrate 101, the fin 103 and/or the substrate 101 may comprise a single material or a plurality of materials. In this context, the fin 103 refers to the portion extending between the neighboring isolation regions 105.

A dummy gate dielectric layer 107 is along sidewalls and over a top surface of the fin 103, and a dummy gate electrode 109 is over dummy gate dielectric layer 107. Source/drain regions 111 (once regrown) are disposed in opposite sides of the fin 103 with respect to dummy gate dielectric layer 107 and dummy gate electrode 109. FIG. 1 further illustrates reference cross-section X-X that is used in later figures. Cross-section X-X is perpendicular to a longitudinal axis of the dummy gate electrode 109 of the finFET and extends through the source/drain regions 111 on opposing sides of the dummy gate electrode 109 of the finFET in a direction parallel to, for example, a current flow between the source/drain regions 111 of the finFET. Subsequent figures refer to this reference cross-section X-X for clarity. However, while FIG. 1 only illustrates one of the fins 103 formed from the substrate 101, any number of the fins 103 may be utilized and multiple fins 103 and associated structures are illustrated in subsequent figures.

Some embodiments discussed herein are discussed in the context of finFETs formed using a gate-last process. In other embodiments, a gate-first process may be used. Also, some embodiments contemplate aspects used in planar devices, such as planar FETs, nanostructure (e.g., nanosheet, nanowire, gate-all-around, or the like) field effect transistors (NS-FETs), or the like.

Figure 2:
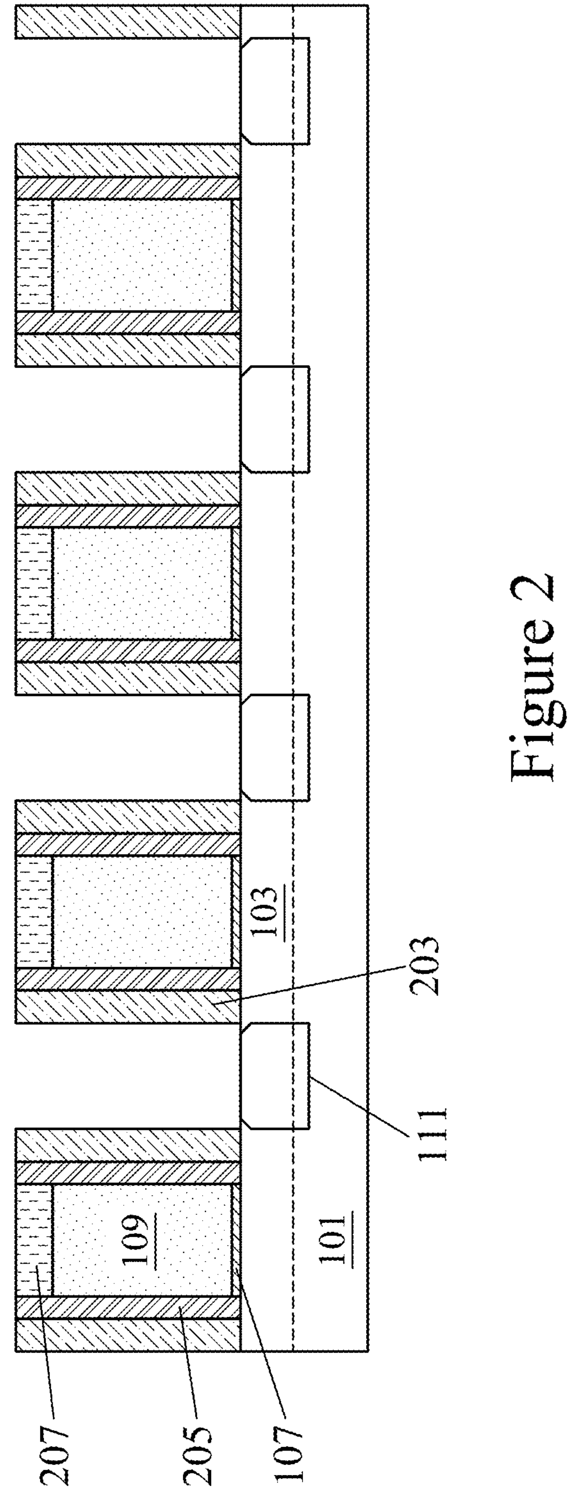
FIG. 2 illustrates the formation of source/drain regions, gate spacers and dummy gate masks, in accordance with some embodiments.

With reference to FIGS. 1 and 2 (with FIG. 2 illustrating additional structures), these figures illustrate some initial steps in the formation of finFETs including patterning a plurality of the fins 103 from the substrate 101. The substrate 101 may be a silicon substrate, although other substrates, such as semiconductor-on-insulator (SOI), strained SOI, and silicon germanium on insulator, could be used. The substrate 101 may be a p-type semiconductor, although in other embodiments, it could be an n-type semiconductor. The fins 103 may be patterned by forming trenches using any suitable method. For example, the fins 103 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 103.

However, as one of ordinary skill in the art will recognize, the processes and materials described above to form the series of fins 103 are merely example processes, and are not meant to be the only embodiments. Rather, any suitable process through which the fins 103 may be formed may be utilized and any suitable process, including any number of masking and removal steps may be used. Once formed, these fins 103 may be used, as discussed below, to form the channel regions and source/drain regions 111 of a plurality of finFET transistors. After the fins 103 have been formed within the substrate 101, the isolation regions 105, such as shallow trench isolation (STI) regions may be formed to isolate the fins 103 from other regions within the substrate 101. As such, the trenches may be filled with a dielectric material and the dielectric material may be recessed within the trenches to form the isolation regions 105. The dielectric material may be an oxide material, a high-density plasma (HDP) oxide, or the like. The dielectric material may be formed, after an optional cleaning and lining of the trenches, using either a chemical vapor deposition (CVD) method, a high density plasma CVD method, or any other suitable method of formation may be used.

The trenches may be filled by overfilling the trenches and the substrate 101 with the dielectric material and then removing the excess material outside of the trenches and the fins 103 through a suitable process such as chemical mechanical polishing (CMP), an etch, a combination of these, or the like. In an embodiment, the removal process removes any dielectric material that is located over the fins 103 as well, so that the removal of the dielectric material will expose the surface of the fins 103 to further processing steps.

Once the trenches have been filled with the dielectric material, the dielectric material may then be recessed away from the surface of the fins 103. The recessing may be performed to expose at least a portion of the sidewalls of the fins 103 adjacent to the top surface of the fins 103. The dielectric material may be recessed using a wet etch by dipping the top surface of the fins 103 into an etchant such as HF, although other etchants, such as $H_2$, and other methods, such as a reactive ion etch, a dry etch with etchants such as $NH_3/NF_3$, chemical oxide removal, or dry chemical clean may be used. The dielectric material may be recessed to a distance from the surface of the fins 103 of between about 50 Å and about 500 Å, such as about 400 Å. Additionally, the recessing may also remove any leftover dielectric material located over the fins 103 to ensure that the fins 103 are exposed for further processing.

The steps described above may be only part of the overall process flow used to fill and recess the dielectric material. For example, lining steps, cleaning steps, annealing steps, gap filling steps, combinations of these, and the like may also be utilized to form and fill the trenches with the dielectric material. All of the potential process steps are fully intended to be included within the scope of the present embodiment.

After the isolation regions 105 have been formed, appropriate wells (not shown) may be formed in the fins 103 and/or the substrate 101. In some embodiments, different well types are formed within different n-type regions and the p-type regions of the fins 103 and/or the substrate 101. As such, the different implant steps for the n-type regions and the p-type regions may be achieved using a photoresist and/or other masks (not shown). For example, a photoresist may be formed over the fins 103 and the isolation regions 105 in the n-type regions. The photoresist is patterned to expose the p-type regions of the substrate 101. The photoresist can be formed by using a spin-on technique and can be patterned using acceptable photolithography techniques. Once the photoresist is patterned, an n-type impurity implant is performed in the p-type regions, and the photoresist may act as a mask to substantially prevent n-type impurities from being implanted into the n-type regions. The n-type impurities may be phosphorus, arsenic, antimony, or the like implanted in the region to a concentration of equal to or less than $10^{18}$ $cm^{-3}$, such as between about $10^{16}$ $cm^{-3}$ and about $10^{18}$ $cm^{-3}$. After the implant, the photoresist is removed, such as by an acceptable ashing process.

Following the implanting of the p-type regions, a photoresist can be formed over the fins 103 and the isolation regions 105 in the p-type region and then patterned to expose the n-type regions of the substrate 101 to initiate an implanting of the n-type regions. Once the photoresist is patterned, a p-type impurity implant may be performed in the n-type regions using the photoresist as a mask to substantially prevent p-type impurities from being implanted into the p-type regions. The p-type impurities may be boron, boron fluoride, indium, or the like implanted in the region to a concentration of equal to or less than $10^{18}$ $cm^{-3}$, such as between about $10^{16}$ $cm^{-3}$ and about $10^{18}$ $cm^{-3}$. After the implant, the photoresist may be removed, such as by an acceptable ashing process.

After the implants of the n-type regions and the p-type regions, an anneal process may be performed to repair implant damage and to activate the p-type and/or n-type impurities that were implanted. In some embodiments in which the fins 103 or a portion of the fins 103 are grown, the grown materials of epitaxial of the fins 103 may be in situ doped during growth, which may obviate the implantations, although in situ and implantation doping may be used together.

Once the wells have been formed in the fins 103 and/or the substrate 101, a dummy gate dielectric layer 107 and a dummy gate electrode 109 may be formed over each of the fins 103. Initially, a dummy gate dielectric (or interface oxide) layer and a dummy gate electrode layer over the dummy gate dielectric layer may be formed over each of the fins 103. In an embodiment the dummy gate dielectric layer may be formed by thermal oxidation, chemical vapor deposition, sputtering, or any other methods known and used in the art for forming a gate dielectric layer. Depending on the technique of formation, the dummy gate dielectric layer thickness on the top of the fins 103 may be different from the dummy gate dielectric layer thickness on the sidewall of the fins 103.

The dummy gate dielectric layer may comprise a material such as silicon dioxide or silicon oxynitride with a thickness of between about 3 Å and about 100 Å, such as about 10 Å. The dummy gate dielectric layer may be formed from a high permittivity (high-k) material (e.g., with a relative permittivity greater than about 5) such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of between about 0.5 Å and about 100 Å, such as about 10 Å or less. Additionally, any combination of silicon dioxide, silicon oxynitride, and/or high-k materials may also be used for the dummy gate dielectric layer.

The dummy gate electrode layer may comprise a conductive material and may be selected from a group comprising of polysilicon (e.g., a dummy polysilicon (DPO)), W, Al, Cu, AlCu, Ti, TiAlN, TaC, TaCN, TaSiN, Mn, Zr, TiN, Ta, TaN, Co, Ni, combinations of these, or the like. The dummy gate electrode layer may be deposited by chemical vapor deposition (CVD), sputter deposition, or other suitable techniques for depositing conductive materials. The thickness of the dummy gate electrode layer may be between about 5 Å and about 200 Å. The top surface of the dummy gate electrode layer may have a non-planar top surface, and may be planarized prior to patterning of the dummy gate electrode layer or performing the gate etching process. Ions may or may not be introduced into the dummy gate electrode layer at this point. Ions may be introduced, for example, by ion implantation techniques.

Once formed, the dummy gate dielectric layer and the dummy gate electrode layer may be patterned to form a series of dummy gate dielectric layers 107 and dummy gate electrodes 109 over the fins 103. The dummy gate electrodes 109 may be formed by depositing and patterning a hard mask 207 on the dummy gate electrode layer using, for example, any suitable deposition and photolithography techniques. The hard mask 207 may incorporate any suitable masking and sacrificial materials, such as (but not limited to) silicon oxide, silicon oxynitride, SiCON, SiC, SiOC, and/or silicon nitride and may be deposited to a thickness of between about 5 Å and about 200 Å. The dummy gate electrode layer and the dummy gate dielectric layer may be etched using a dry etching process to form the dummy gate electrodes 109 and the dummy gate dielectric layer 107. As such, the dummy gate electrodes 109 define multiple channel regions located on each side of the fins 103 beneath the dummy gate dielectric layer 107.

Turning to FIG. 2, which illustrates additional ones of the dummy gate dielectric layers 107 and the dummy gate electrodes 109 over the fin 103, wherein the fins 103 may be in the same or different regions of the substrate 101, once the dummy gate electrodes 109 have been patterned, gate spacers 203 may be formed on opposing sides of the dummy gate electrodes 109, according to some embodiments. The gate spacers 203 are formed, for example, by blanket depositing a stack of spacer layers on the previously formed structure. The spacer layer may comprise a different material with different etch characteristics or the same material as the dielectric material within the isolation regions 105. The insulating material of the gate spacers 203 may be silicon oxide, silicon nitride, silicon oxynitride, silicon carbonitride, a combination thereof, or the like. The gate spacers 203 may then be patterned, such as by one or more etches to remove the spacer layer from the horizontal surfaces of the structure, to form the gate spacers 203.

According to some embodiments, optional gate seal spacers 205 may be formed prior to formation of the gate spacers 203. The optional gate seal spacers 205 can be formed by blanket deposition on exposed surfaces of the dummy gate electrodes 109, the masks, and/or the fins 103. The optional gate seal spacers 205 may comprise SiCON, SiN, oxynitride, SiC, SiON, SiOC, oxide, or the like and may be formed by any suitable methods to form such a layer, such as chemical vapor deposition (CVD), plasma enhanced chemical vapor deposition (PECVD), sputter, and any other suitable methods. A thermal oxidation or a deposition followed by an anisotropic etch may form the optional gate seal spacers 205.

After the formation of the gate spacers 203, implants for lightly doped source/drain (LDD) regions (not explicitly illustrated) may be performed. In the embodiments with different device types, similar to the implants discussed above, a mask, such as a photoresist, may be formed over regions of the structure to be protected and appropriate type (e.g., p-type or n-type) impurities may be implanted into the exposed fins 103 in the unmasked region. The mask may then be removed. Subsequent masking and implantation processes may be performed to appropriately dope different regions of the structure based on desired devices being formed. The lightly doped source/drain regions may have a concentration of impurities of from about 1015 $cm^{-3}$ to about 1019 $cm^{-3}$. An anneal process may be used to repair implant damage and to activate the implanted impurities.

It is noted that the above disclosure generally describes a process of forming spacers and LDD regions. Other processes and sequences may be used. For example, fewer or additional spacers may be utilized, a different sequence of steps may be utilized (e.g., the optional gate seal spacers 205 may not be etched prior to forming the gate spacers 203, yielding "L-shaped" gate seal spacers), spacers may be formed and removed, and/or the like.

FIG. 2 additionally illustrates, beyond the structure illustrated in FIG. 1, that once the gate spacers 203 have been formed, portions of the fins 103 not protected by the dummy gate electrodes 109 and the gate spacers 203 are removed using a reactive ion etch (RIE) using the dummy gate electrodes 109 and the gate spacers 203 as hard masks, or by using any other suitable removal process. The removal may be continued until the fins 103 are either planar with or below the surface of the isolation regions 105.

Once the portions of the fins 103 have been removed, the fins 103 are regrown, e.g., through a selective epitaxial (EPI) growth process of the material of the fins 103, to form the source/drain regions 111 of the finFETs being developed. In an embodiment wherein the fins 103 comprise silicon and the finFET is a p-type device, the source/drain regions 111 may be regrown with a material, such as silicon, silicon germanium, silicon phosphorous, which has a different lattice constant than the channel regions. The epitaxial growth process may use precursors such as silane, dichlorosilane, germane, or the like, and may continue for between about 5 minutes and about 120 minutes, such as about 30 minutes. In other embodiments the source/drain regions 111 may comprise materials such as GaAs, GaP, GaN, InP, InAs, InSb, GaAsP, AlGaN, AlInAs, AlGaAs, GaInAs, GaInP, and/or GaInAsP; or combinations, or the like.

Once the source/drain regions 111 are formed, dopants may be implanted into the source/drain regions 111 by implanting appropriate dopants to complement the dopants in the fins 103. For example, p-type dopants such as boron, gallium, indium, or the like may be implanted to form a PMOS device. In another embodiment, n-type dopants such as phosphorous, arsenic, antimony, or the like may be implanted to form an NMOS device. These dopants may be implanted using the dummy gate electrodes 109, the optional gate seal spacers 205 and the gate spacers 203 as masks. However, any other suitable processes, steps, or the like may be used to implant the dopants. For example, a plurality of implantation processes may be performed using various combinations of spacers and liners to form the source/drain regions 111 having a specific shape or characteristic suitable for a particular purpose. Any of these processes may be used to implant the dopants, and the above description is not meant to limit the present embodiments to the steps presented above.

Figure 3:
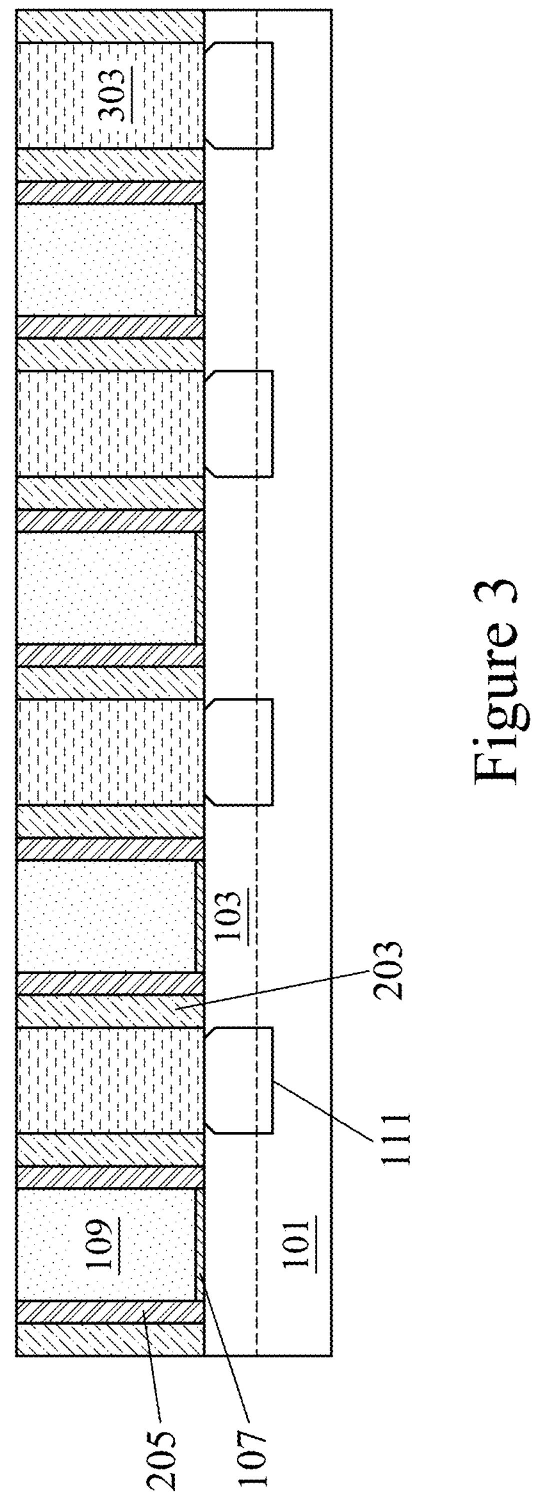
FIG. 3 illustrates the formation of a first interlayer dielectric (ILD), in accordance with some embodiments.

FIG. 3 illustrates a formation of a first interlayer dielectric (ILD) layer 303 over the source/drain regions 111, according to some embodiments. Once the source/drain regions 111 have been formed, the first ILD layer 303 is deposited over the exposed areas of the substrate 101. According to some embodiments, the first ILD layer 303 may comprise a material such as silicon oxide ($SiO_2$) or boron phosphorous silicate glass (BPSG), although any suitable dielectrics may be used. The first ILD layer 303 may be formed using a chemical vapor deposition (CVD) process such as plasma enhanced chemical vapor deposition (PECVD), although any other suitable processes, such as low pressure chemical vapor deposition (LPCVD), may also be used.

Once formed, the first ILD layer 303 may be annealed using, e.g., a first annealing process. In an embodiment the first annealing process may be a thermal anneal wherein the substrate 101 and the first ILD layer 303 are heated within, e.g., a furnace, within an inert atmosphere. The first anneal process may be performed at a temperature of between about 200° C. and about 1000° C., such as about 500° C., and may be continued for a time of between about 60 s and about 360 min, such as about 240 min. Once deposited and annealed, the first ILD layer 303, the gate spacers 203 and the optional gate seal spacers 205 (if present) are planarized to expose the dummy gate electrodes 109 in a planar surface of the first ILD layer 303, wherein the planarization process may also remove the hard mask 207 if still present.

Figure 4:
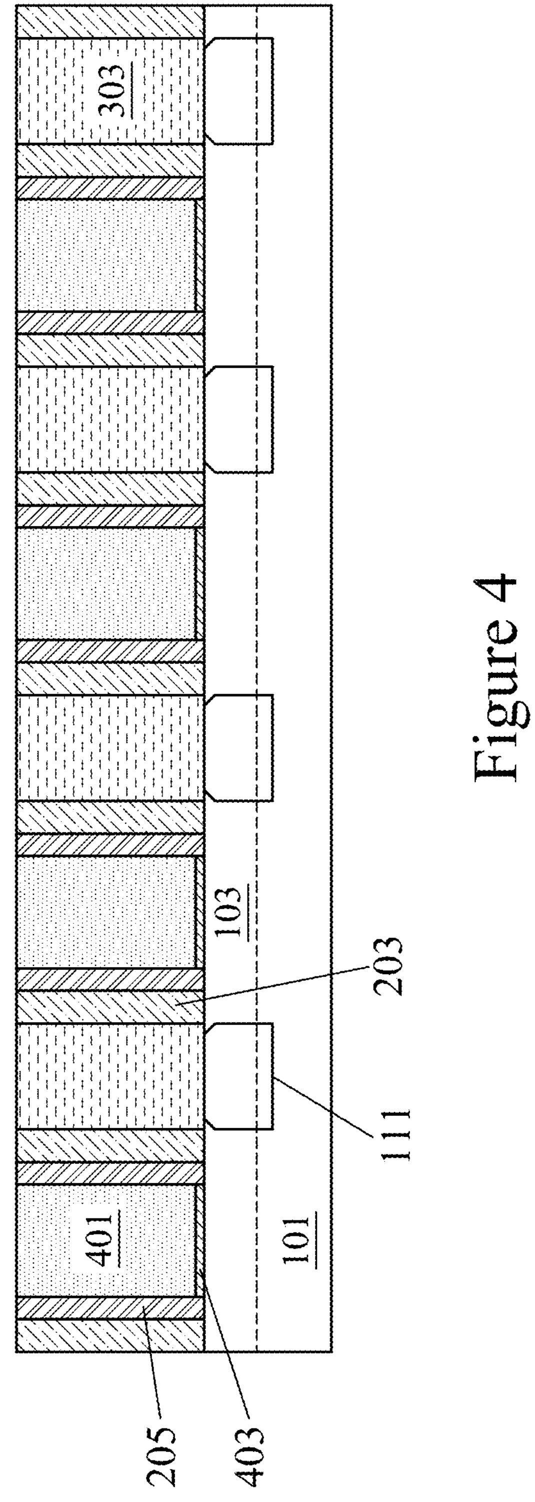
FIG. 4 illustrates the replacement of the dummy dielectric and the dummy gate with gate dielectric layers and gate electrodes, in accordance with some embodiments.

Turning to FIG. 4, once exposed, the dummy gate electrodes 109 and dummy gate dielectric layer 107 are subsequently removed using, e.g., one or more wet etch processes and are replaced with, e.g., high-k gate dielectric layers 403 and gate electrodes 401, including, for example, one or more conductive barrier layers, one or more work function layers, and a conductive fill material. According to some embodiments, the high-k gate dielectric layer 403 includes materials such as $HfO_2$, $ZrO_2$, $HfZrO_x$, $HfSiO_x$, HfSiON, $ZrSiO_x$, $HfZrSiO_x$, $Al_2O_3$, $HfAlO_x$, HfAlN, $ZrAlO_x$, $La_2O_3$, $TiO_2$, $Yb_2O_3$, or the like and may be a single layer or a composite layer that is formed using a deposition process such as atomic layer deposition. However, any suitable materials and any suitable processes may be used to form the high-k gate dielectric layer 403.

According to some embodiments, the one or more diffusion barrier layers and the one or more work-function layer may be formed as a plurality of stacked layers. For example, the barrier layers may be formed as a layer of titanium nitride (TiN) which may (or may not) be doped with silicon. The work-function layer, in the case of a p-type finFET may be formed with a respective gate electrode 401 as a stacked layer including Ti, Al, TiAl, TiAlN, Ta, TaN, TiAlC, TaAlCSi, TaAlC, TiSiN, or the like. In the case of an n-type finFET being formed with a respective gate electrode 401, the work-function layer may be formed with a respective gate electrode 401 as a stacked layer including TiN, TaN, TiAl, W, Ta, Ni, Pt, or the like. After the deposition of the work-function layer(s) in these embodiments, a barrier layer (e.g., another TiN layer) is formed.

According to some embodiments, the conductive fill material may be formed from a material such as tungsten, cobalt, copper, ruthenium, aluminum, or the like. The conductive fill material is deposited over the stacked layers of the high-k gate dielectric layer 403, the one or more conductive barrier layers, the one or more work function layers such that the remaining spaces, between respective gate spacers 203 of a respective gate electrode 401 are filled or over-filled.

Once the layers of the gate electrodes 401 have been deposited and the remaining spaces are completely filled (or over-filled) with the conductive fill material, the materials are then planarized using a chemical mechanical polish (CMP) process. The CMP process may perform a thinning of the materials of the gate electrodes 401, the materials of respective gate spacers 203, optional gate seal spacers 205 (if present), and the first ILD layer 303 until planarized surfaces of the gate electrodes 401 and the gate spacers 203 are exposed in a planar surface of the first ILD layer 303.

Figure 5:
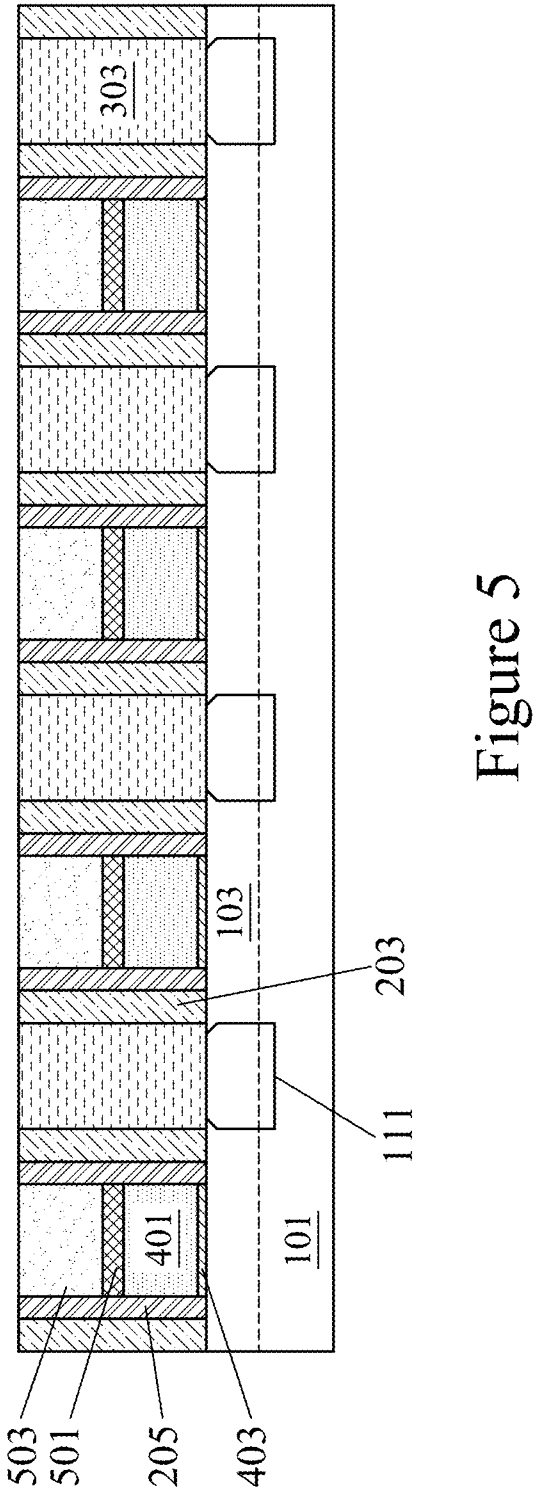
FIG. 5 illustrates the formation of a gate contact layer and a gate mask, in accordance with some embodiments.

In FIG. 5, the gate electrodes 401 are recessed (using, e.g., a wet etching process) and a gate contact layer 501 may be deposited over the recessed gate electrodes 401. The gate contact layer 501 may be formed of tungsten, such as fluorine-free tungsten (FFW), which is deposited by a selective deposition process, such as a selective CVD process.

However, the gate contact layer 501 may include other conductive materials, such as ruthenium, cobalt, copper, molybdenum, nickel, combinations thereof, or the like and may be deposited using a suitable deposition process (e.g., ALD, CVD, PVD, or the like).

A gate mask 503 comprising one or more layers of dielectric material, such as silicon nitride, silicon oxynitride, or the like, is deposited over the gate contact layer 501 and fills the remainder of the recess. The deposition of the gate mask 503 may be followed by a planarization process to planarize the gate mask 503 and remove any undesired thickness of the dielectric material. The planarization process may be a chemical mechanical polishing process, although any suitable planarization process may be used.

Figure 6:
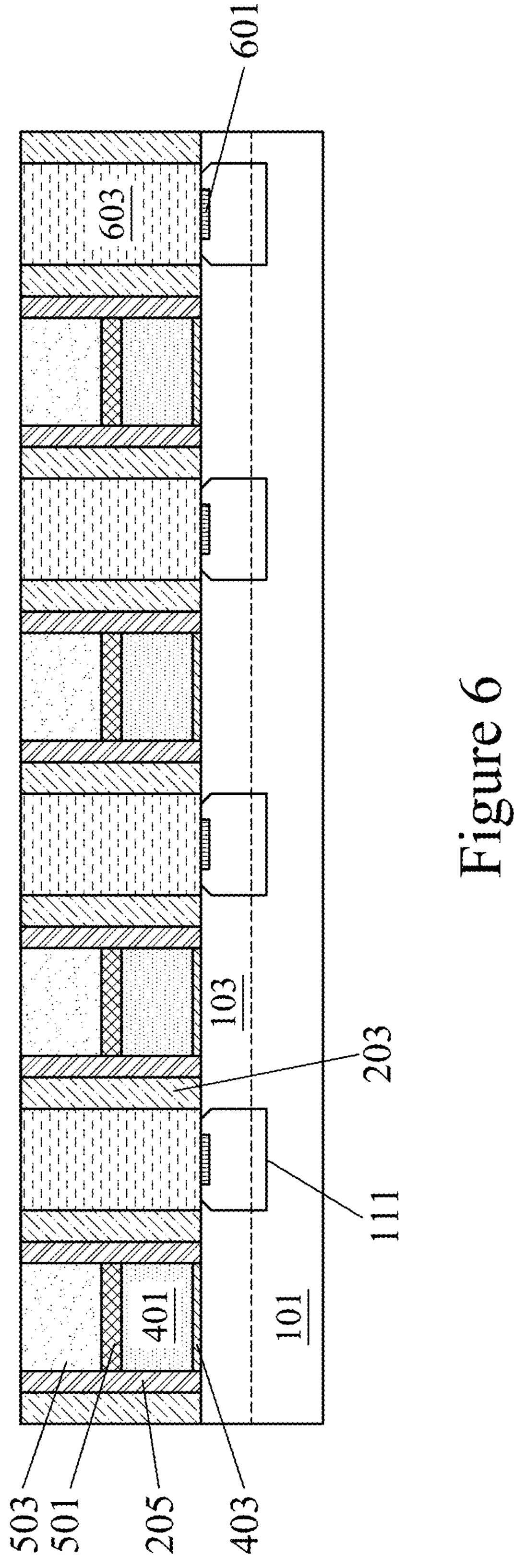
FIG. 6 illustrates the formation of silicide regions and source/drain plugs, in accordance with some embodiments.

In FIG. 6, silicide regions 601 and source/drain plugs 603 are formed through the first ILD layer 303. The first ILD layer 303 may be etched to form recesses exposing surfaces of the source/drain regions 111. The recesses may be formed by etching using anisotropic etch processes, such as RIE, NBE, or the like. A mask, such as a photoresist, may be formed and patterned over the first ILD layer 303 to mask portions of the first ILD layer 303, the gate spacers 203, and the gate mask 503 from the first etch process and the second etch process. In some embodiments, the etch processes may over-etch, and therefore, the recesses may extend into the source/drain regions 111. Bottom surfaces of the recesses may be level with (e.g., at a same level, or having a same distance from the substrate 101), or lower than (e.g., closer to the substrate 101) top surfaces of the source/drain regions 111.

After the recesses are formed, the silicide regions 601 may be formed. In some embodiments, the silicide regions 601 are formed by first depositing a metal (not separately illustrated) capable of reacting with the semiconductor materials of the underlying source/drain regions 111 (e.g., silicon, silicon germanium, germanium, or the like) to form silicide or germanide regions, such as nickel, cobalt, titanium, tantalum, platinum, tungsten, other noble metals, other refractory metals, rare earth metals or their alloys, over the exposed portions of the source/drain regions 111. A thermal anneal process may then be performed to form the silicide regions 601. Un-reacted portions of the deposited metal are removed by an etch process. Although referred to as silicide regions, the silicide regions 601 may also be germanide regions, silicon germanide regions (e.g., regions comprising silicide and germanide), or the like. In an embodiment, the silicide regions 601 comprise TiSi, and have a thickness ranging from about 2 nm to about 10 nm.

The source/drain plugs 603 are then formed over the silicide regions 601 and filling the recesses. The source/drain plugs 603 may each comprise one or more layers, such as barrier layers, diffusion layers, and fill materials. For example, in some embodiments, the source/drain plugs 603 each include a barrier layer and a conductive material over the barrier layer. The conductive material of each of the source/drain plugs 603 may be electrically coupled to the underlying source/drain regions 111 through the silicide regions 601. The barrier layer may include titanium, titanium nitride, tantalum, tantalum nitride, or the like. The conductive material may be tungsten (W), cobalt (Co), ruthenium (Ru), titanium (Ti), copper (Cu), a copper alloy, silver (Ag), gold (Au), aluminum (Al), nickel (Ni), or the like. After the source/drain plugs 603 are formed, a planarization process, such as a CMP, may be performed to remove excess material from surfaces of the first ILD layer 303 and the gate mask 503.

Figure 7A:
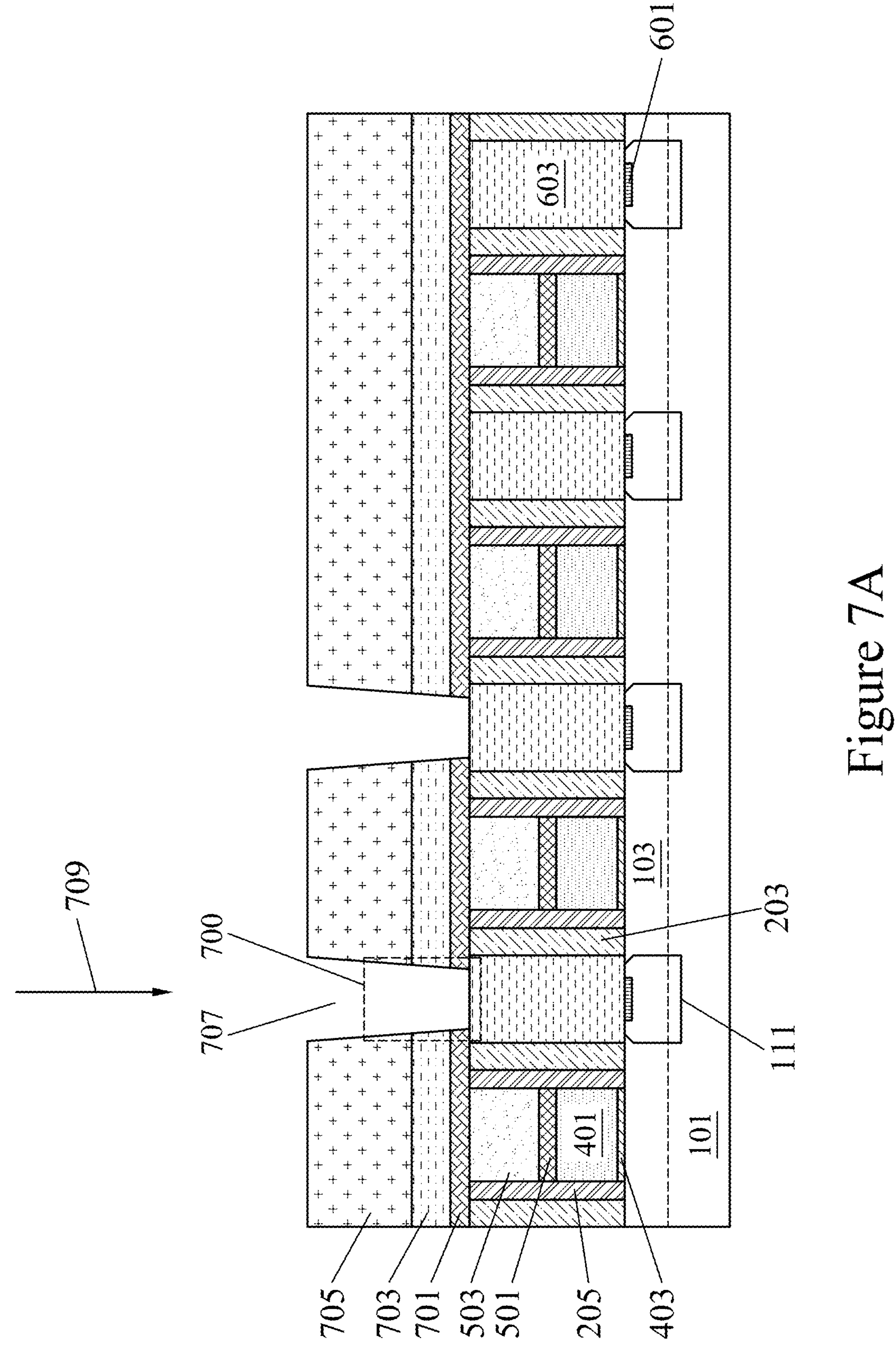
FIGS. 7A-7B illustrates the formation of a first etch stop layer, a contact etch stop layer, a second interlayer dielectric, and formation of an opening, in accordance with some embodiments.

In FIG. 7A, a first etch stop layer 701 is formed over exposed surfaces of the gate mask 503, the gate spacers 203 (and the optional gate seal spacers 205) and the source/drain plugs 603, according to some embodiments. In an embodiment, the first etch stop layer 701 may be formed as a nitride film, e.g., silicon nitride, silicon oxynitride, combinations of these, or the like, using a deposition process such as CVD, PVD, ALD, combinations, or the like. However, any suitable deposition process may be used. As such, a top surface of the first etch stop layer 701 may have a profile the same as or similar to top surfaces of the underlying gate mask 503 and the source/drain plugs 603.

FIG. 7A further illustrates the formation of a contact etch stop layer (CESL) 703 over the first etch stop layer 701, according to some embodiments. The contact etch stop layer 703 may comprise a dielectric material, such as silicon oxide, silicon nitride, silicon oxynitride, or the like, having a different etch rate than the material of the overlying second ILD 705 and the underlying first etch stop layer 701. The contact etch stop layer 703 may be deposited by a conformal deposition process, such as ALD, CVD, or the like. As such, a top surface of the contact etch stop layer 703 may have a profile the same as or similar to top surfaces of the underlying first etch stop layer 701.

The second ILD 705 may be formed of a dielectric material, and may be deposited by any suitable method, such as CVD, PECVD, or FCVD. Suitable dielectric materials may include silicon oxide, silicon nitride, silicon oxynitride, PSG, BSG, BPSG, USG, or the like, having a different etch rate than the material of the underlying contact etch stop layer 703. Other insulation materials formed by any acceptable process may be used. After the second ILD 705 is deposited, a planarization process, such as a CMP, may be performed to planarize a top surface of the second ILD 705.

FIG. 7A further illustrates, according to some embodiments, a formation of first openings 707 through the second ILD 705, the contact etch stop layer 703, and the first etch stop layer 701 down to (or even partially into) the source/drain plugs 603 using a first etching process (represented in FIG. 7A by the arrow labeled 709). Once the second ILD 705 has been formed, the first openings 707 can be formed using a series of one or more acceptable photolithography and etching techniques using, e.g., hydrogen ($H_2$) in combination with nitrogen ($N_2$) as one of the etchants. However, any suitable methods may be utilized.

Figure 7B:
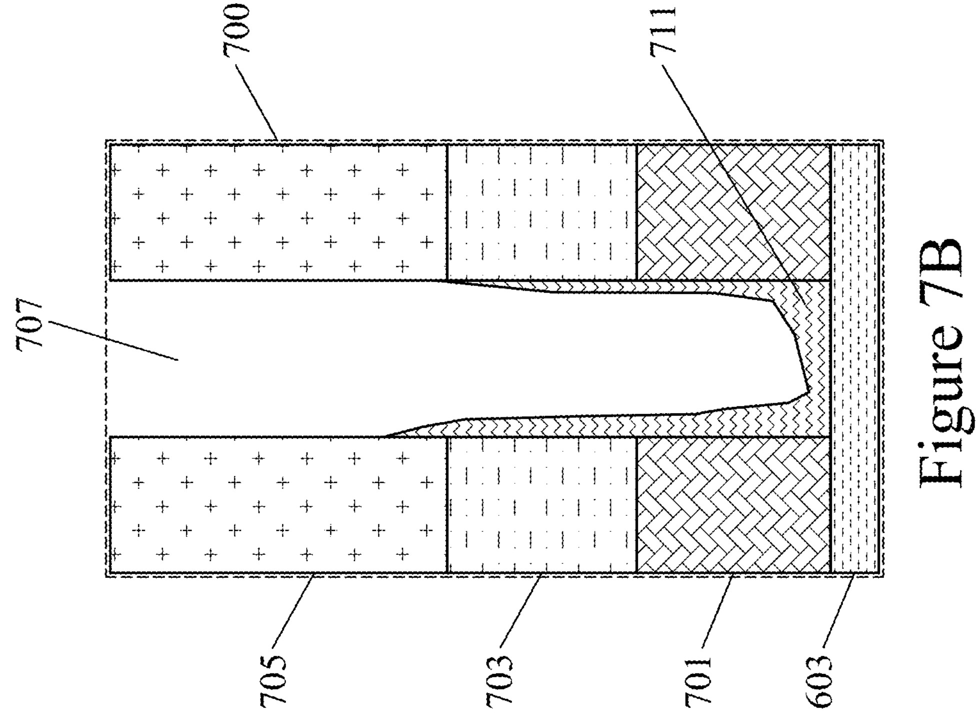

FIG. 7B illustrates a close-up view of the dashed box 700 in FIG. 7A, and helps to illustrate that, as the series of one or more etching processes are used to form the first openings 707, the etching processes not only form the first openings 707, but additionally cause undesirable by-products 711 to be formed. These by-products 711 are undesired and can cause further issues if left in during subsequent manufacturing processes. For example, the by-products can interfere with the deposition of further materials into the first openings 707, or else may undesirably interact with the surrounding materials.

Figure 8:
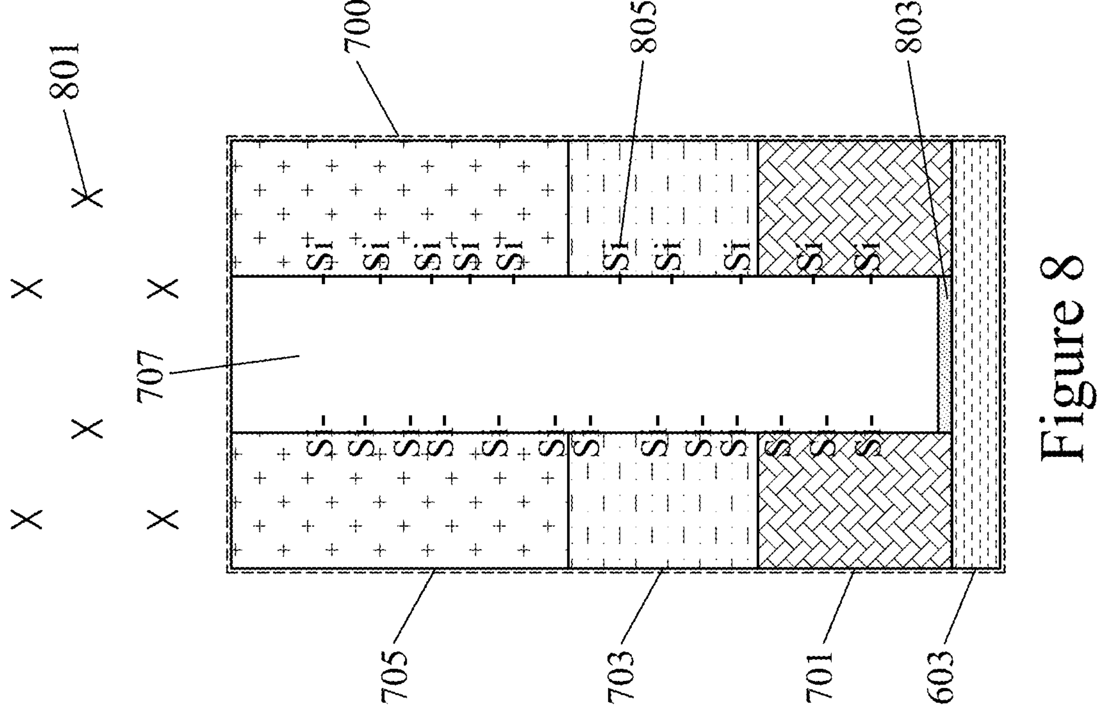
FIG. 8 illustrates a wet clean process, in accordance with some embodiments.

FIG. 8 illustrates that, once the first openings 707 have been formed, a wet clean process (represented in FIG. 8 by the "X"s labeled 801) may be performed in order to help remove the by-products 711. In an embodiment the wet clean process 801 may be performed using a solution such as an SC-1 or SC-2 cleaning solution (e.g., a solution of ammonium hydroxide ($NH_4OH$), hydrogen peroxide ($H_2O_2$), and water), although other solutions, such as a mixture of $H_2SO_4$ and $H_2O_2$ (known as SPM), or a solution of hydrogen fluoride (HF), may also be utilized. Any suitable solution or process that may be used are fully intended to be included within the scope of the embodiments.

FIG. 8 additionally illustrates that, after the first openings 707 and the wet clean process 801 have been performed, and while these processes did work to remove all or most of the by-products 711, these processes have also caused multiple defects within the exposed surfaces (e.g., the sidewalls of the first openings 707 and the bottom of the first openings 707). For example, the sidewalls of the first openings 707 may be damaged such that there are now dangling bonds (e.g., dangling silicon bonds, represented in FIG. 8 by the "Si—" s labeled 805) that line some or all of the sidewalls, such as the sidewalls of the first etch stop layer 701, the contact etch stop layer 703 and the second ILD 705. Such dangling bonds will interfere with subsequent processes.

Additionally, the reactants utilized during the formation and/or cleaning of the first openings 707 may either react with or else diffuse into the sidewalls of the first openings 707. As such, various undesired by-products and/or other impurities are present along the sidewalls, such as SiOF, SiON, and/or SiOH, or the like. These by-products and impurities will also interfere with subsequent processes.

Finally, some of the reactants utilized during the formation and cleaning of the first openings 707 will also undesirably react with the exposed surface of the source/drain plugs 603 to form an undesired first layer 803. For example, in an embodiment in which the source/drain plugs 603 is tungsten and oxygen or nitrogen are utilized within the formation and cleaning of the first openings 707, the exposed surface of the source/drain plugs 603 may react and form the first layer 803 as a first metal oxide or a first metal oxynitride, such as tungsten oxide. The presence of this undesired first layer 803 can further interfere with subsequent processing or performance.

Figure 9:
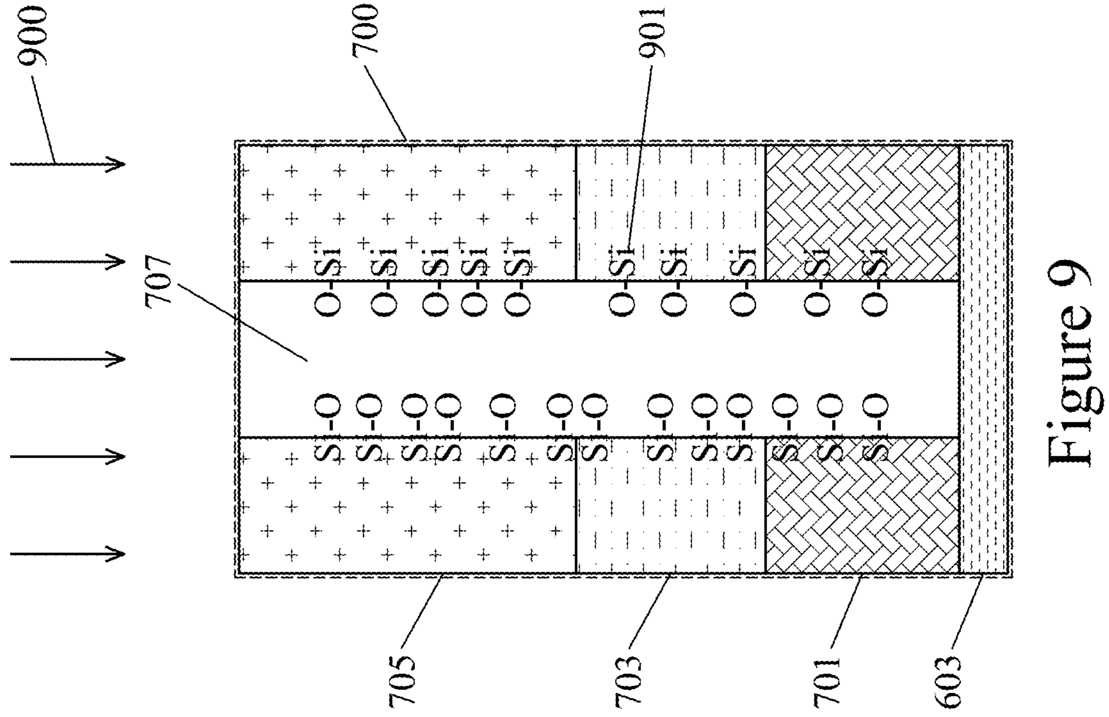
FIG. 9 illustrates a post-clean treatment, in accordance with some embodiments.

FIG. 9 illustrates a post-clean treatment (represented in FIG. 9 by the arrows labeled 900) that may be used in order to both repair the sidewalls of the first openings 707 and also remove the first layer 803 (see FIG. 8). In an embodiment the post-clean treatment 900 utilizes a plasma formed from a gas mixture, wherein the gas mixture includes at least a first treatment precursor (e.g., a sidewall treatment precursor) and a second treatment precursor (e.g., a metal oxide treatment precursor). However, any suitable gas mixture of precursors may be utilized.

In an embodiment the first treatment precursor is a gas that, once turned into a plasma (described further below) will work to repair the sidewall dangling bonds 805 along the first etch stop layer 701, the contact etch stop layer 703, and the second ILD 705. In a particular embodiment the first treatment precursor may be a gas such as diatomic oxygen ($O_2$) or the like. However, any suitable gases may be utilized.

The second treatment precursor may be a gas that, once turned into a plasma (described further below) will work to remove the first layer 803. In a particular embodiment in which the first layer 803 is tungsten oxide, the second treatment precursor may be a gas such as diatomic hydrogen ($H_2$) or the like. However, any suitable gases may be utilized.

To initiate the post-clean treatment 900, the first treatment precursor and the second treatment precursor are mixed together to form a treatment mixture and then the treatment mixture is directed to a plasma generator such as remote plasma block (not separately illustrated). In an embodiment the treatment mixture may have a flow ratio of the first treatment precursor (e.g., oxygen) to the second treatment precursor (e.g., hydrogen) of between about 5% to about 95%. However, any suitable flow ratios or other concentrations may be utilized.

In an embodiment the plasma block has an inlet port that receives the treatment mixture and an outlet port that is coupled to deliver a first treatment plasma (converted from the first treatment precursor and the second treatment precursor) to the first openings 707. In an embodiment in which the plasma block is a magnetic plasma generator, the first treatment precursor and the second treatment precursor enter the plasma block and pass between a magnetic core that surrounds a portion of the plasma block. The magnetic core is utilized to induce the formation of the first treatment plasma from the first treatment precursor and the second treatment precursor that enters the plasma block.

The magnetic core may be situated around a portion of the flow path through the plasma block from the inlet port to the outlet port. In an embodiment the magnetic core is one portion of a transformer, with a primary coil forming another portion of the transformer. In an embodiment the primary coil may have a winding of between about 100 and about 1000 such as about 600. To generate the desired first treatment plasma from the first treatment precursor and the second treatment precursor within the plasma block, a short, high-voltage pulse of electricity may be applied to the primary coil. The high-voltage pulse of electricity in the primary coil is transformed to a pulse of energy into the magnetic core, which induces the formation of the first treatment plasma from the first treatment precursor and the second treatment precursor within the plasma block. In an embodiment the high-voltage pulse may be between about 10 kHz and about 30 MHz such as about 13.56 MHz, while the temperature is between about 50° C. and about 200° C. and with a pressure of between about 1 torr and about 20 torr. However, any suitable process parameters may be utilized.

However, while igniting the first treatment precursor and the second treatment precursor with a magnetic coil is described as an embodiment that may be used, the embodiments are not so limited. Rather, any suitable methods or structures may be used to ignite the first treatment precursor and the second treatment precursor to form the first treatment plasma. For example, in other embodiments a high voltage pulse may be applied to an electrode (not illustrated) coupled to the plasma block, or the first treatment precursor and the second treatment precursor may be exposed to a ultraviolet radiation that may be used to ignite the first treatment precursor and the second treatment precursor and form the first treatment plasma. Any suitable method of igniting the first treatment precursor and the second treatment precursor and any other suitable plasma inducing device are fully intended to be included within the scope of the embodiments.

Once the first treatment plasma has been generated, the first treatment plasma may be directed into the first openings 707 and the treatment may be performed. In an embodiment the treatment may be performed at a temperature of between about 100° C. and about 400° C. and a pressure of between about 0.5 Torr and about 6 Torr. The treatment may be performed either until the first layer 803 has been removed or else may be timed to stop after a time of between about 30 seconds and about 600 seconds. However, any suitable process parameters may be utilized.

Additionally, in some embodiments the post-clean treatment 900 may be performed in a nitrogen free atmosphere, where no additional nitrogen is introduced or present in the atmosphere during the post-clean treatment 900. In another implementation the post-clean treatment 900 is performed in an inert gas free atmosphere, where no additional inert gases, such as argon, are present in the atmosphere during the post-clean treatment 900.

During the post-clean treatment 900, the first treatment plasma will react with the dangling bonds 805 on the sidewalls of the first openings 707 (e.g., the dangling bonds of the "Si—" in FIG. 8) and form covalent bonds along the sidewalls of the first openings 707. In a particular embodiment in which the sidewalls have the dangling bonds 805 and the first treatment precursor is oxygen (so that the first treatment plasma comprises an oxygen plasma with oxygen ions), the post-clean treatment 900 will react with the dangling bonds 805 to form repaired bonds (represented in FIG. 9 by the "Si—O"s labeled 901), such as silicon dioxide. However, any suitable reactions may be utilized.

Further, in addition to simply repairing the dangling bonds 805, the first treatment plasma will react with, remove and/or otherwise repair the impurities and by-products caused by the formation of the first openings 707. For example, in embodiments in which SiOF, SiON, or SiOH are present and oxygen is utilized for the first treatment precursor, each of these by-products and/or impurities can be reacted either to completion (thereby leaving behind only silicon dioxide) or else reacted to reduce the concentration of the by-products and/or impurities. As such, the post-clean treatment 900 may be used to repair or mitigate damage from the impurities and by-products.

Finally, the post-clean treatment 900 will also work to remove the first layer 803 (see FIG. 8) from the surface of the source/drain plugs 603. In particular, in an embodiment in which the first layer 803 is tungsten oxide and the second treatment precursor is hydrogen (which will form a hydrogen plasma with hydrogen ions), the hydrogen plasma will work to reduce the tungsten oxide using, e.g., the following formula:

$$MeOx + H^{*} \rightarrow Me + H_2O(g)$$

Wherein Me is the metal present within the source/drain plugs 603 (e.g., tungsten). As such, by removing the first layer 803, whether the first layer 803 comprises a metal oxide or a metal oxynitride, the source/drain plugs 603 will again have a surface with oxygen and nitrogen concentrations at least close to the concentrations that were present after deposition.

Figure 10:
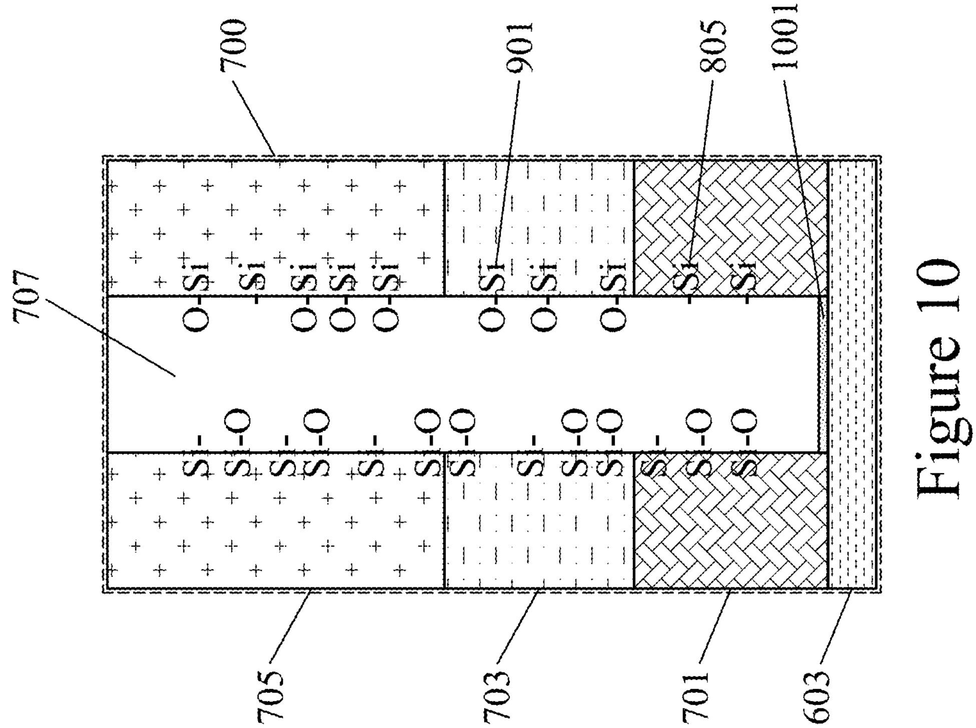
FIG. 10 illustrates an exposure to ambient air, in accordance with some embodiments.

FIG. 10 illustrates that, once the post clean treatment 900 has been performed, the structure including the source/drain plugs 603 may be prepared to fill the first opening 707. However, in preparation, the structure may be removed from, e.g., the etching and treatment chambers used for the formation of the first openings 707, the wet clean process 801, and the post-clean treatment 900, and may be exposed to the ambient air. If exposed to the ambient air, the sidewalls of the first opening 707 and the source/drain plugs 603 may react with, e.g., the gases present within the ambient air (e.g., oxygen). As such, the sidewalls of the first opening 707 (e.g., the exposed surfaces of the first etch stop layer 701, the contact etch stop layer 703, and the second ILD 705) may again be damaged when exposed to the air. For example, some (but not all) of the repaired bonds 901, when interacting with the ambient air, may again revert to dangling bonds 805 and other impurities may again be introduced. If left present within the structure, the newly formed dangling bonds 805 impurities may still interfere with subsequent processing.

Similarly, when the source/drain plugs 603 is exposed to the ambient air, the source/drain plugs 603 may again react with oxygen and/or nitrogen and a second layer 1001 (such as a metal oxide layer, a metal nitride layer, or a metal oxynitride layer) may be formed on the exposed surfaces of the source/drain plugs 603. In an embodiment in which the source/drain plugs 603 are tungsten, the second layer 1001 may be a tungsten oxide.

Figure 11:
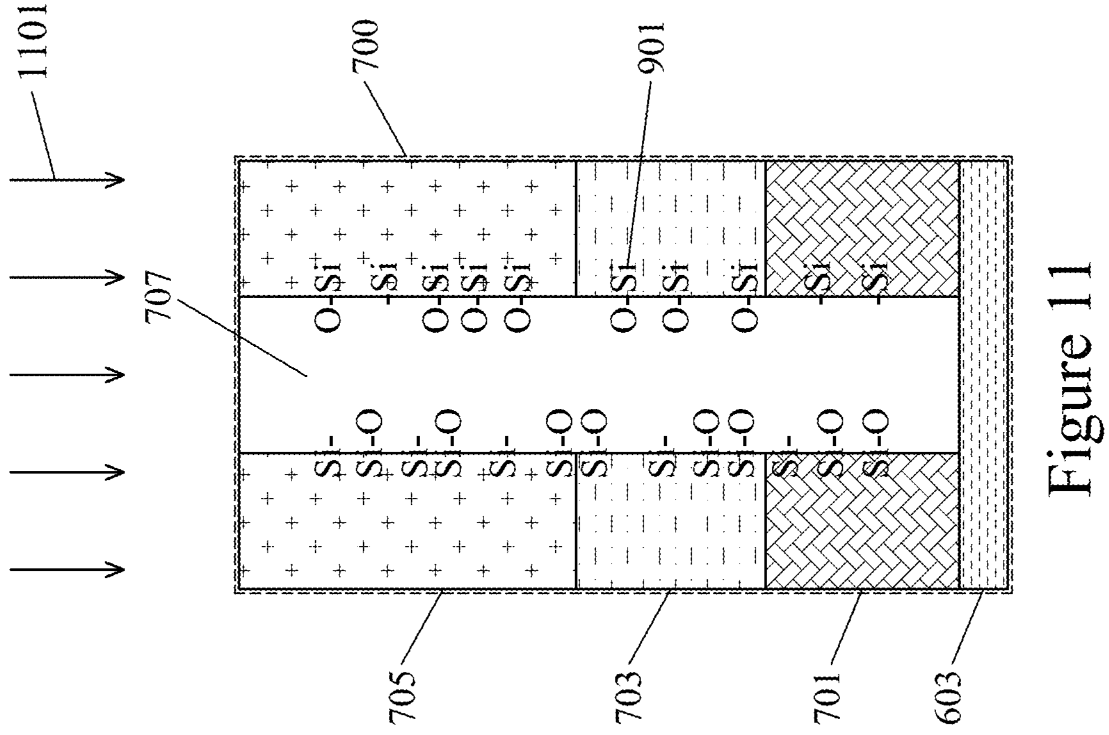
FIG. 11 illustrates a first pre-clean process, in accordance with some embodiments.

FIG. 11 illustrates an optional first pre-clean process (represented in FIG. 11 by the arrows labeled 1101) that may be utilized to remove the second layer 1001 (see FIG. 10) in preparation for the filling of the first opening 707. However, before the first pre-clean process 1101 is begun, a clean (not separately illustrated) may be performed using an inert gas such as argon or other gases such as hydrogen, oxygen, combinations of these, or the like. In an embodiment the clean may be performed by using one or more of the precursors and converting them to a plasma using, for example, the plasma generator described above with respect to the post-clean treatment 900. Once the plasma has been generated, the plasma may be directed towards the surface of the source/drain plugs 603, where it will fully or partially remove the second layer 1001.

Once the clean has been performed (in embodiments where the clean is utilized), the first pre-clean process 1101 may be initiated. In an embodiment the first pre-clean process 1101 may be similar to the post-clean treatment 900 (described above with respect to FIG. 9), but in which only the second treatment precursor is utilized. For example, in an embodiment in which the second layer 1001 is tungsten oxide, the first pre-clean process 1101 may utilize hydrogen as the second treatment precursor without the presence of the first treatment precursor (e.g., without the presence of the oxygen). In an embodiment, the first pre-clean process 1101 may be performed using similar process parameters as described above with respect to the post-clean treatment 900, although any suitable parameters may be utilized.

During the first pre-clean process 1101, the first pre-clean process 1101 will work to remove the second layer 1001 from the surface of the source/drain plugs 603. In particular, in an embodiment in which the second layer 1001 is tungsten oxide and the second treatment precursor is hydrogen, the hydrogen plasma formed from the second treatment precursor will work to reduce the tungsten oxide using, e.g., the following formula:

$$MeOx + H^{*} \rightarrow Me + H_2O(g)$$

Wherein Me is the metal present within the source/drain plugs 603 (e.g., tungsten).

Figure 12:
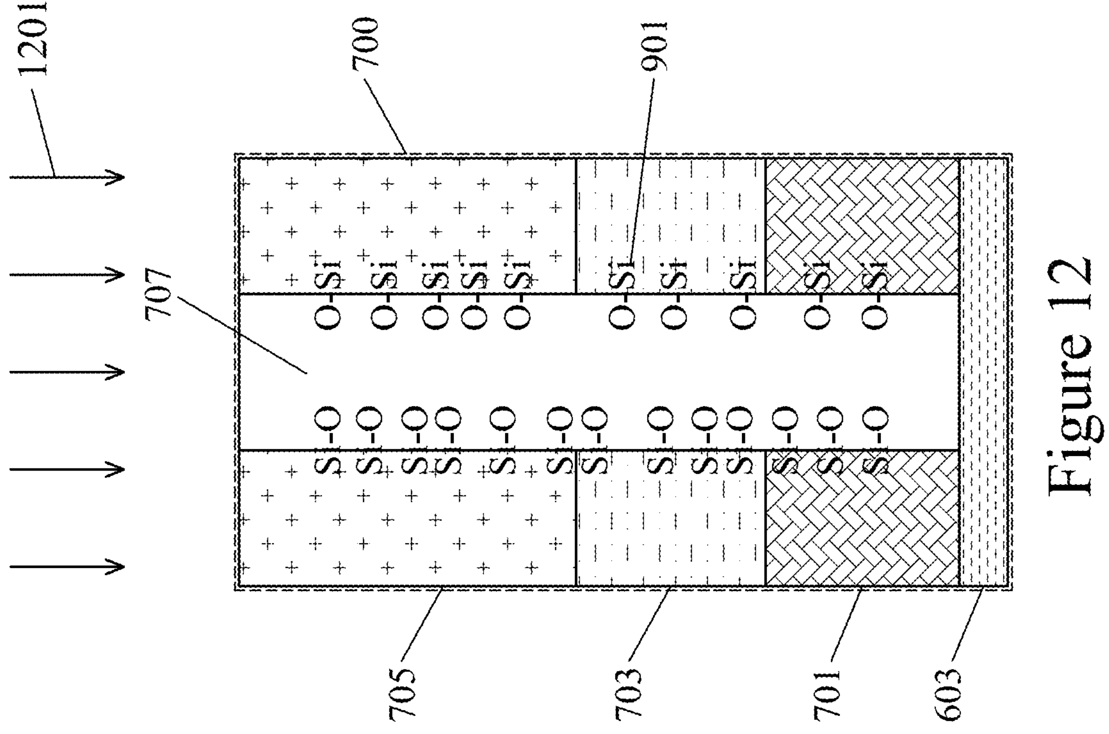
FIG. 12 illustrates a second pre-clean process, in accordance with some embodiments.

FIG. 12 illustrates an optional second pre-clean process 1201 that may be utilized to repair the sidewalls of the first openings 707 in preparation for the filling of the first opening 707. In an embodiment the second pre-clean process 1201 may be similar to the post-clean treatment 900 (described above with respect to FIG. 9), but in which only the first treatment precursor is utilized. For example, in an embodiment in which the sidewalls comprise silicon dangling bonds 805, the second pre-clean process 1201 may utilize oxygen as the first treatment precursor without the presence of the second treatment precursor (e.g., without the presence of the hydrogen). In an embodiment, the second pre-clean process 1201 may be performed using similar process parameters as described above with respect to the post-clean treatment 900, although any suitable parameters may be utilized.

During the second pre-clean process 1201, the first treatment plasma will react with the dangling bonds on the sidewalls of the first openings 707 (e.g., the dangling bonds of the Si-805) and form covalent bonds along the sidewalls of the first openings 707. In a particular embodiment in which the sidewalls have the dangling bonds 805 and the first treatment precursor is oxygen (which forms an oxygen plasma with oxygen ions), the second pre-clean process 1201 will cause the dangling bonds 805 to be repaired to the repaired bonds (represented in FIG. 12 by the "Si—O" labeled 901), such as silicon dioxide. However, any suitable reactions may be utilized.

Figure 13:
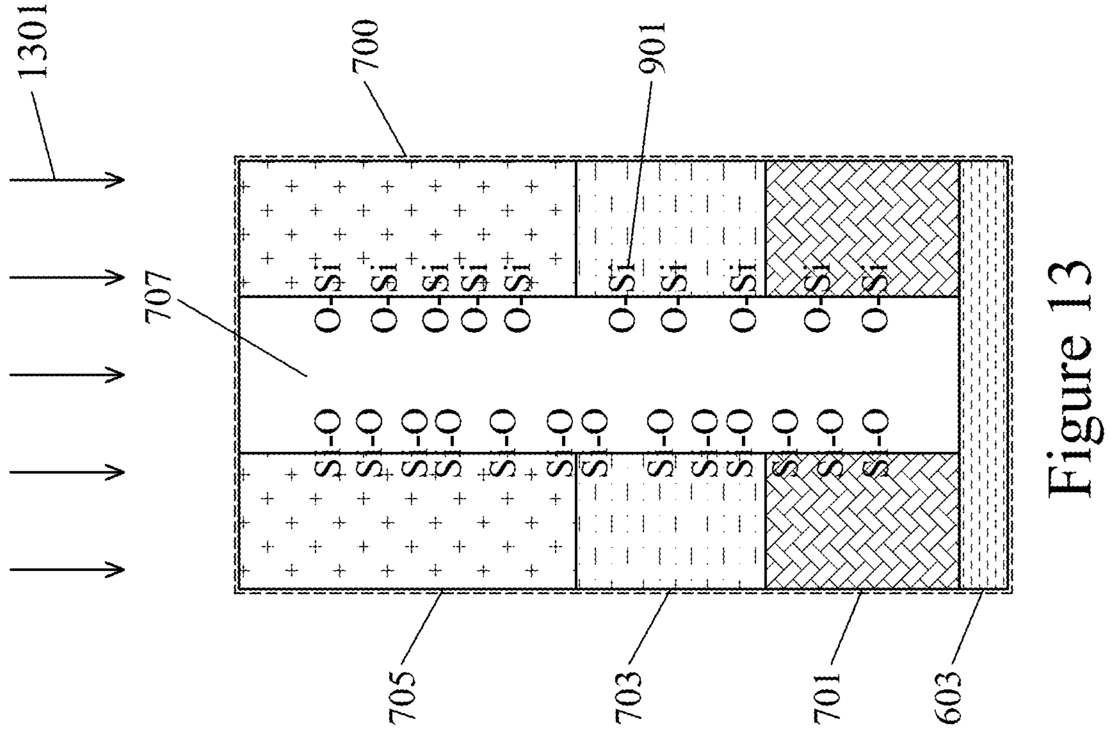
FIG. 13 illustrates a third pre-clean process, in accordance with some embodiments.

FIG. 13 illustrates an optional third pre-clean process (represented in FIG. 13 by the arrows labeled 1301) that may be utilized to remove any oxidation or other damage to the source/drain plugs 603 that may have occurred during the second pre-clean process 1201 and in preparation for the filling of the first opening 707. In an embodiment the third pre-clean process 1301 may be similar to the post-clean treatment 900 (described above with respect to FIG. 9), but in which only the second treatment precursor is utilized. For example, the third pre-clean process 1301 may utilize hydrogen as the second treatment precursor without the presence of the first treatment precursor (e.g., without the presence of the oxygen). In an embodiment, the third pre-clean process 1301 may be performed using similar process parameters as described above with respect to the post-clean treatment 900, although any suitable parameters may be utilized.

During the third pre-clean process 1301, the third pre-clean process 1301 will work to remove any oxidation from the surface of the source/drain plugs 603 that may have occurred during the second pre-clean process 1201. In particular, in an embodiment in which the damage is an oxidation of the surface of the source/drain plugs 603 and the second treatment precursor is hydrogen, the hydrogen plasma formed from the second treatment precursor will work to reduce the tungsten oxide using, e.g., the following formula:

$$MeOx + H^* \rightarrow Me + H_2O(g)$$

Wherein Me is the metal present within the source/drain plugs 603 (e.g., tungsten).

Of course, as the first pre-clean process 1101, the second pre-clean process 1201, and the third pre-clean process 1301 are optional, one or more of these steps may be omitted, and the manufacturing process may move straight from any of the post-clean treatment 900, the first pre-clean-process 1101, the second pre-clean process 1201, and the third pre-clean process 1301 to the subsequent steps (describe below with respect to FIG. 14). This is especially useful in manufacturing processes where the structure is not exposed to an ambient environment and, thus, the ambient environment does not re-damage or re-oxidize the structure.

In yet another embodiment the first pre-clean process 1101, the second pre-clean process 1201, and the third pre-clean process 1301 may be performed directly after the wet clean process 801. In this embodiment one or more of the first pre-clean process 1101, the second pre-clean process 1201, and the third pre-clean process 1301 are performed prior to the post-clean treatment 900 and, once the post-clean treatment 900 is completed, the manufacturing process moves straight from the post-clean treatment 900 to the following steps.

In yet another embodiment in which the first pre-clean process 1101, the second pre-clean process 1201, and the third pre-clean process 1301 are performed after the wet clean process 801, and in which the structure is exposed to an ambient air after the post-clean treatment 900, one or more of the first pre-clean process 1101, the second pre-clean process, and the third pre-clean process 1301 may be performed both before and after the post-clean treatment 900. As such, one or more of the first pre-clean process 1101, the second pre-clean process 1201, and the third pre-clean process 1301 are repeated both before and/or after the post-clean treatment 900. Any suitable combination of these steps, in any suitable order, may be performed, and all such combinations are fully intended to be included within the scope of the current embodiments.

Figure 14:
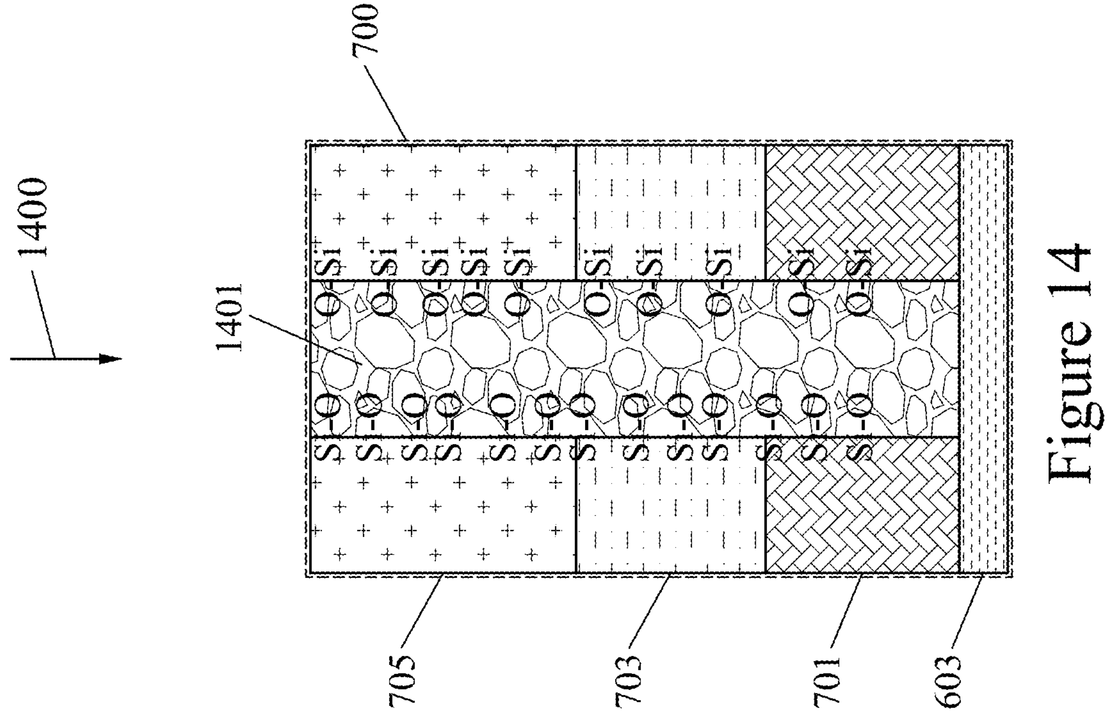
FIG. 14 illustrates formation of source/drain contacts, in accordance with some embodiments.

FIG. 14 illustrates that, after the third pre-clean process 1301 (if performed) prepares the first openings 707, a first conductive fill material is deposited to fill the first openings 707 to form the source/drain contacts 1401 using a first deposition process (represented in FIG. 14 by the arrow labeled 1400). In an embodiment, the first conductive fill material comprises a metal such as tungsten (W), cobalt (Co), ruthenium (Ru), alloys thereof, and the like, and the first conductive fill material is deposited to fill the first openings 707. Furthermore, the first conductive fill material may be deposited using a deposition process such as a chemical vapor deposition (CVD) to perform a bottom-up selective loss free deposition. In a bottom-up deposition, the first conductive fill material has a single growth front that propagates vertically in the first openings 707. As such, seams are prevented from forming in the first conductive fill material. However, any suitable conductive fill materials and any suitable processes may be utilized to develop the source/drain contacts 1401 within the first openings 707.

In an embodiment the deposition process may utilize precursors such as tungsten fluoride ($WF_6$) and hydrogen ($H_2$), although any suitable precursors such as $W(CO)_6$, $(NH_3)_3W(CO)_3$, $WCl_5$, $C_{10}H_{12}W$, $WH_2(iPrCp)_2$, the like, or a combination thereof, may be utilized. In a particular embodiment using tungsten fluoride and hydrogen as the precursors, the tungsten fluoride ($WF_6$) may be flowed into a reaction chamber at a flow rate of between about 50 sccm and about 450 sccm, such as about 100 sccm, while the hydrogen ($H_2$) may be flowed in at the same time at a flow rate of between about 1,000 sccm and about 7,000 sccm, such as about 2000 sccm. Additionally, the chemical vapor deposition process may be performed at a temperature of between about 200° C. and about 400° C., such as about 300° C., and at a pressure of between about 10 torr and about 300 torr, such as about 20 torr. However, any suitable precursors and any suitable process conditions may be utilized.

Once the first conductive fill material has been deposited, an anneal process or reflow process may be performed to form the source/drain contacts 1401. Once filled or overfilled, any deposited material outside of the first openings 707 for the source/drain contacts 1401 may be removed using a planarization process such as chemical mechanical polishing (CMP) to planarize the source/drain contacts 1401 with a planarized surface of the second ILD layer 705.

Figure 15:
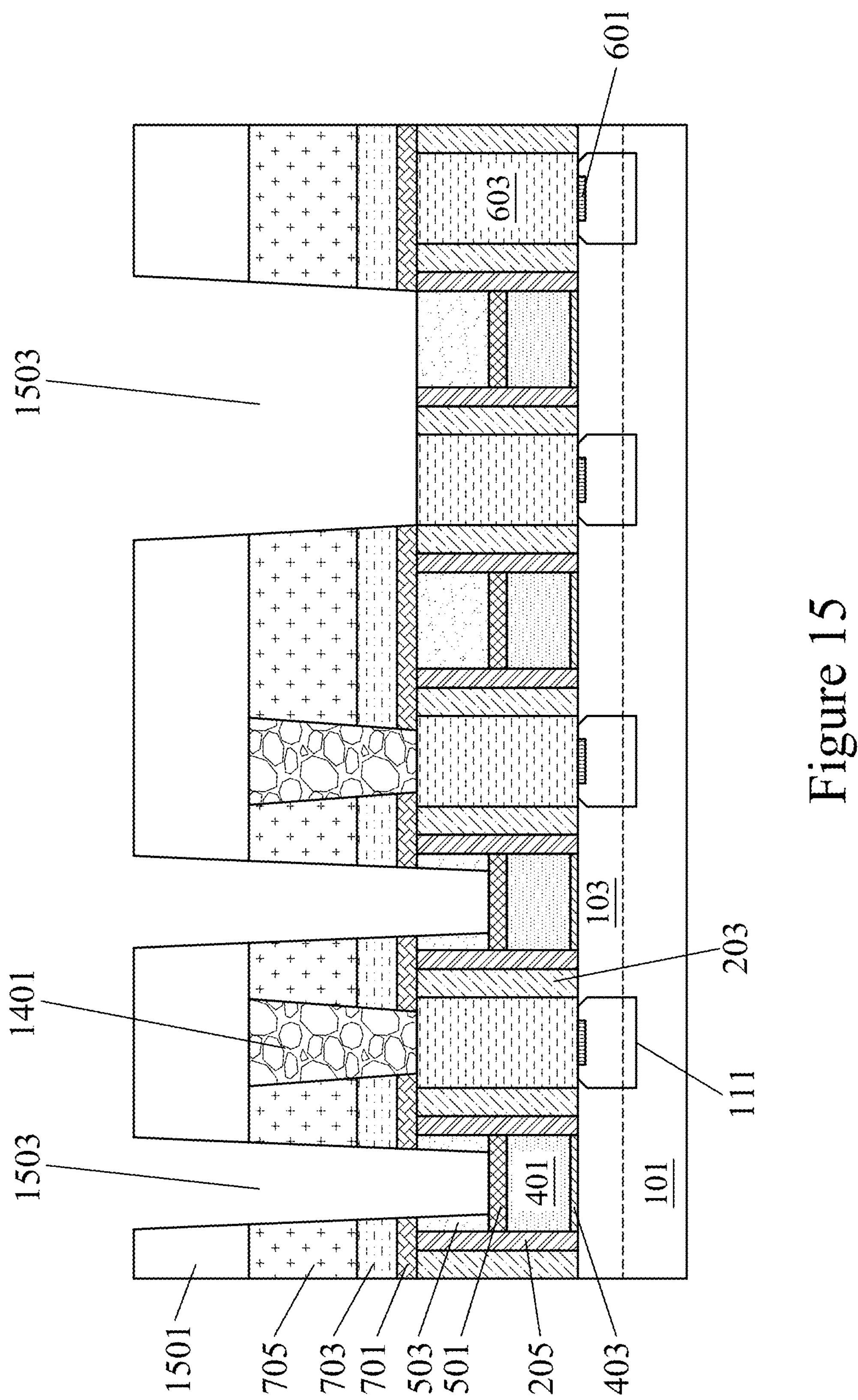
FIG. 15 illustrates deposition of a third ILD and formation of openings, in accordance with some embodiments.

FIG. 15 illustrates the formation of a third ILD 1501 over the second ILD 705 and over the source/drain contacts 1401, according to some embodiments. The third ILD 1501 may be formed of a dielectric material, and may be deposited by any suitable method, such as CVD, PECVD, or FCVD. Suitable dielectric materials may include PSG, BSG, BPSG, USG, or the like. Other insulation materials formed by any acceptable process may be used. After the third ILD 1501 is deposited, a planarization process, such as a CMP, may be performed to planarize a top surface of the third ILD 1501.

FIG. 15 further illustrates, according to some embodiments, a formation of second openings 1503 through the third ILD 1501, the second ILD 705, and the contact etch stop layer 703 down to the first etch stop layer 701. The second openings 1503 can be formed using a series of one or more acceptable photolithography and etching techniques. According to some embodiments, a second etching process may be performed using precursors such as trifluoromethane ($CHF_3$) and hydrogen ($H_2$) to etch through the third ILD 1501, the second ILD 705 and punch through the contact etch stop layer 703. However, any suitable etchants, and any suitable number or combination of etching processes, may be utilized, and all such etchants and combinations are fully intended to be included within the scope of the embodiments.

FIG. 15 further illustrates, according to some embodiments, a continuation of the second etching process that may be carried out to extend the second openings 1503 down to the gate contact layer 501 and/or the source/drain plugs 603. According to some embodiments, the second etching process may be performed using precursors such as carbon tetrafluoride ($CF_4$) and hydrogen ($H_2$) to etch through the first etch stop layer 701 and the gate mask 503. However, any suitable etchants, and any suitable number or combination of etching processes, may be utilized, and all such etchants and combinations are fully intended to be included within the scope of the embodiments.

Figure 16:
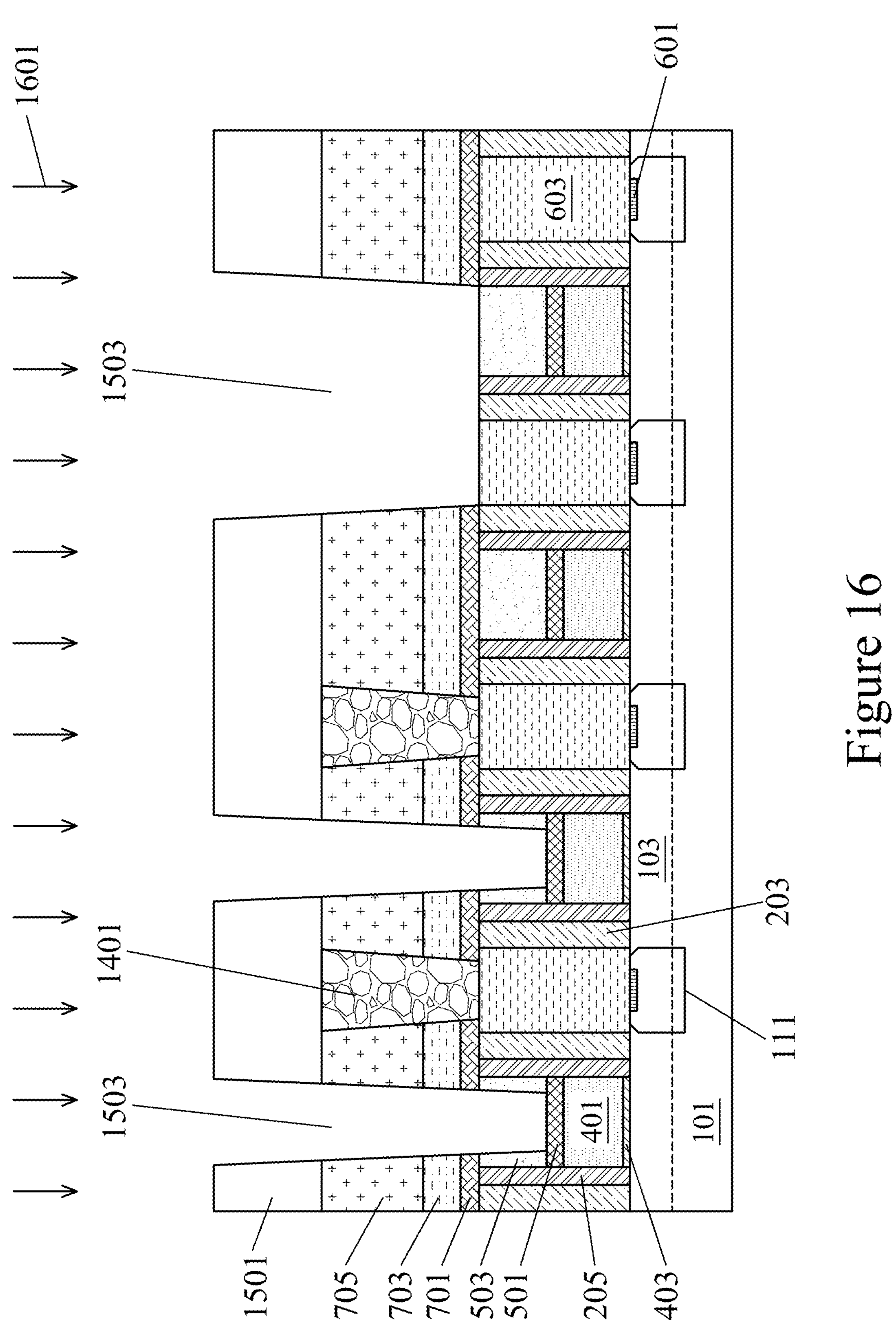
FIG. 16 illustrates a second post-clean treatment, in accordance with some embodiments.

FIG. 16 illustrates that, once the second openings 1503 have been formed, a second post-clean treatment (represented in FIG. 16 by the arrows labeled 1601) may be performed to help repair the damage and remove any undesired layers. In an embodiment the second post-clean treatment 1601 may be similar to the post-clean treatment 900 (described above with respect to FIG. 9). However, any suitable process may be utilized.

Additionally, if desired, after the second post-clean treatment 1601 has been performed, and if the structure is exposed to an ambient atmosphere, a third pre-clean process (not separately illustrated) and a fourth pre-clean process (not separately illustrated) may be performed. In an embodiment the third pre-clean process and the fourth pre-clean process may be similar to the first pre-clean process 1101 (described above with respect to FIG. 11) and the second pre-clean process 1201 (described above with respect to FIG. 12). However, any suitable processes, in any suitable order, may be utilized.

Figure 17:
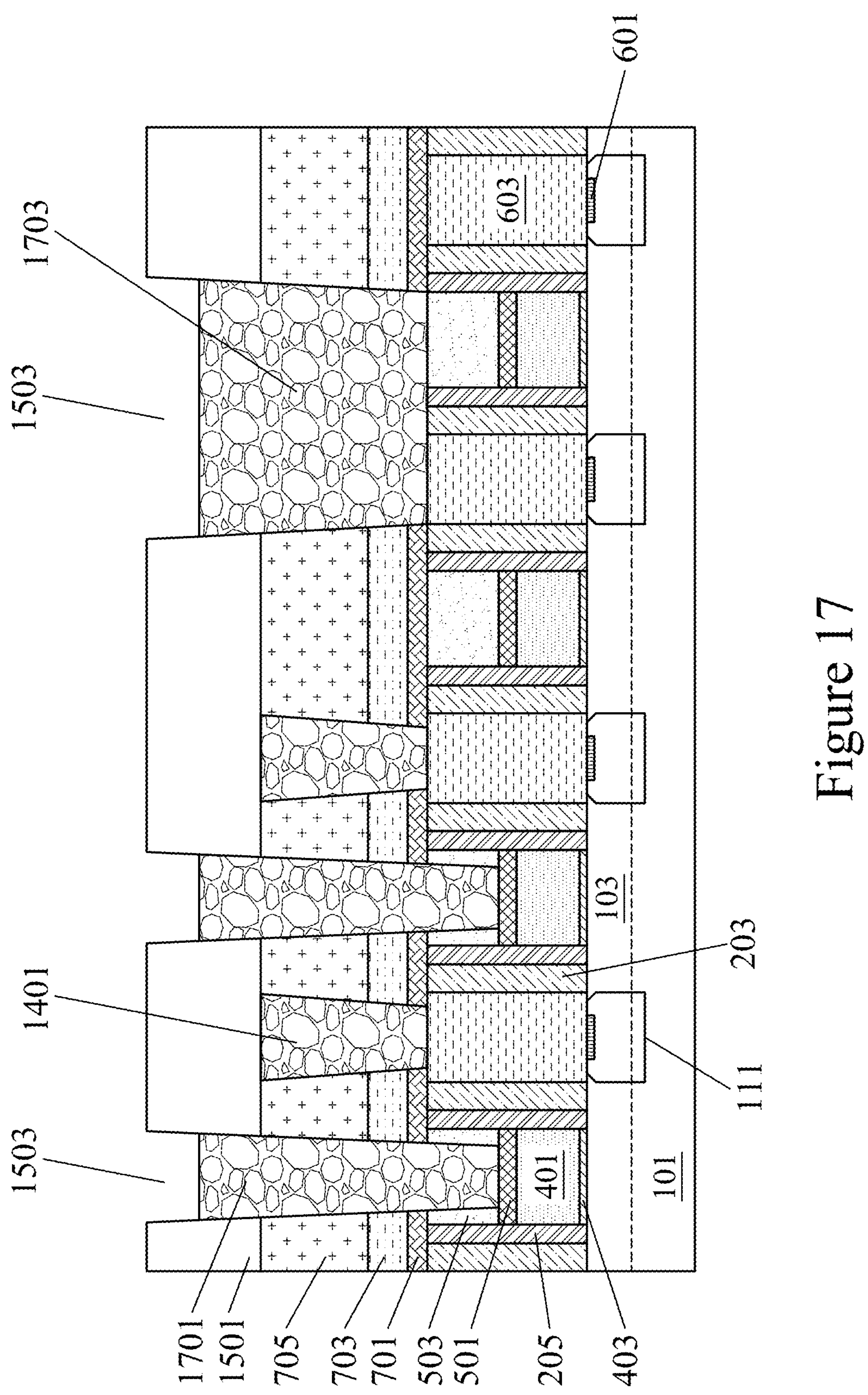
FIG. 17 illustrates deposition of gate electrode contacts, in accordance with some embodiments.

FIG. 17 illustrates the development of subsequent structures within the second openings 1503. Specifically, the figure illustrates the formation of gate electrode contacts 1701 along with a butted contact 1703. Accordingly, a second conductive fill material is deposited to fill the second openings 1503. The second conductive fill material may be a metal, such as tungsten, cobalt, copper, ruthenium, aluminum. Furthermore, the conductive fill material may be deposited using a deposition process such as a chemical vapor deposition (CVD) to perform a bottom-up selective loss free deposition. In a bottom-up deposition, the conductive fill material has a single growth front that propagates vertically in the second openings 1503; as such, seams are prevented from forming in the conductive fill material. However, any suitable conductive fill materials and any suitable processes may be utilized to develop the gate electrode contacts 1701 and butted contact 1703 within the second openings 1503.

In an embodiment the deposition process may utilize precursors such as tungsten fluoride ($WF_6$) and hydrogen ($H_2$), although any suitable precursors such as $W(CO)_6$, $(NH_3)_3W(CO)_3$, $WCl_5$, $C_{10}H_{12}W$, $WH_2(iPrCp)_2$, the like, or a combination thereof, may be utilized. In a particular embodiment using tungsten fluoride and hydrogen as the precursors, the tungsten fluoride ($WF_6$) may be flowed into a reaction chamber at a flow rate of between about 50 sccm and about 450 sccm, such as about 100 sccm, while the hydrogen ($H_2$) may be flowed in at the same time at a flow rate of between about 1,000 sccm and about 7,000 sccm, such as about 2000 sccm. Additionally, the chemical vapor deposition process may be performed at a temperature of between about 200° C. and about 400° C., such as about 300° C., and at a pressure of between about 10 torr and about 300 torr, such as about 20 torr. However, any suitable precursors and any suitable process conditions may be utilized.

Figure 18:
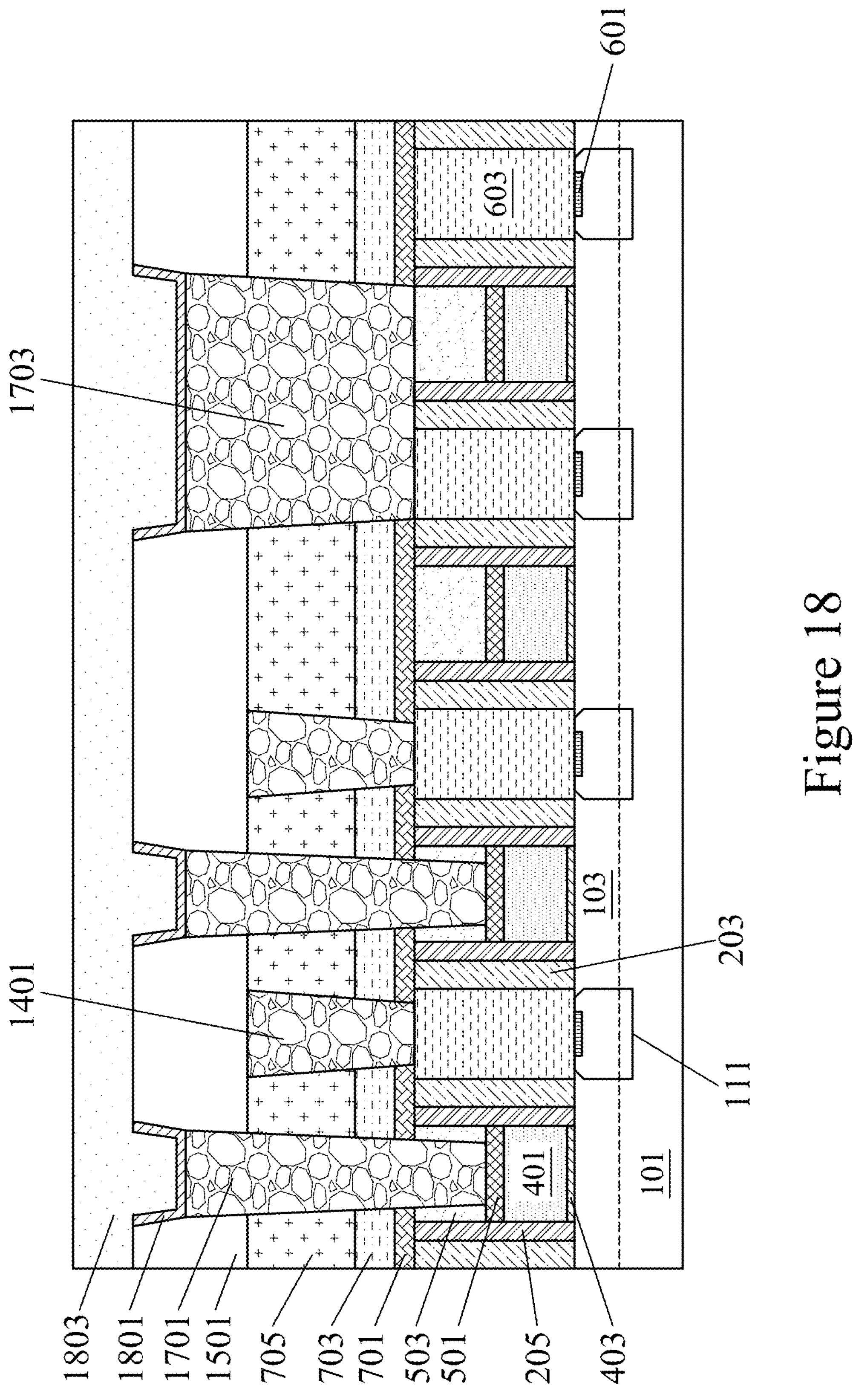
FIG. 18 illustrates deposition of a plug, in accordance with some embodiments.

FIG. 18 illustrates an embodiment where, following the formation of gate electrode contacts 1701 and butted contact 1703, a barrier layer 1801 is deposited over the remaining exposed surfaces in the second openings 1503. In one implementation the barrier layer 1801 comprises titanium or titanium nitride and may be deposited by CVD. However, any suitable materials and any suitable processes may be utilized to deposit the barrier layer 1801. Following the deposition of the barrier layer 1801, a plug 1803 may be formed over the barrier layer 1801 and over the third ILD 1501. In an implementation the plug 1803 is formed from the same material as the gate electrode contacts (e.g., tungsten). In one implementation the plug 1803 comprises tungsten and may be deposited by CVD. However, any suitable materials and any suitable processes may be utilized to deposit the plug 1803.

Figure 19:
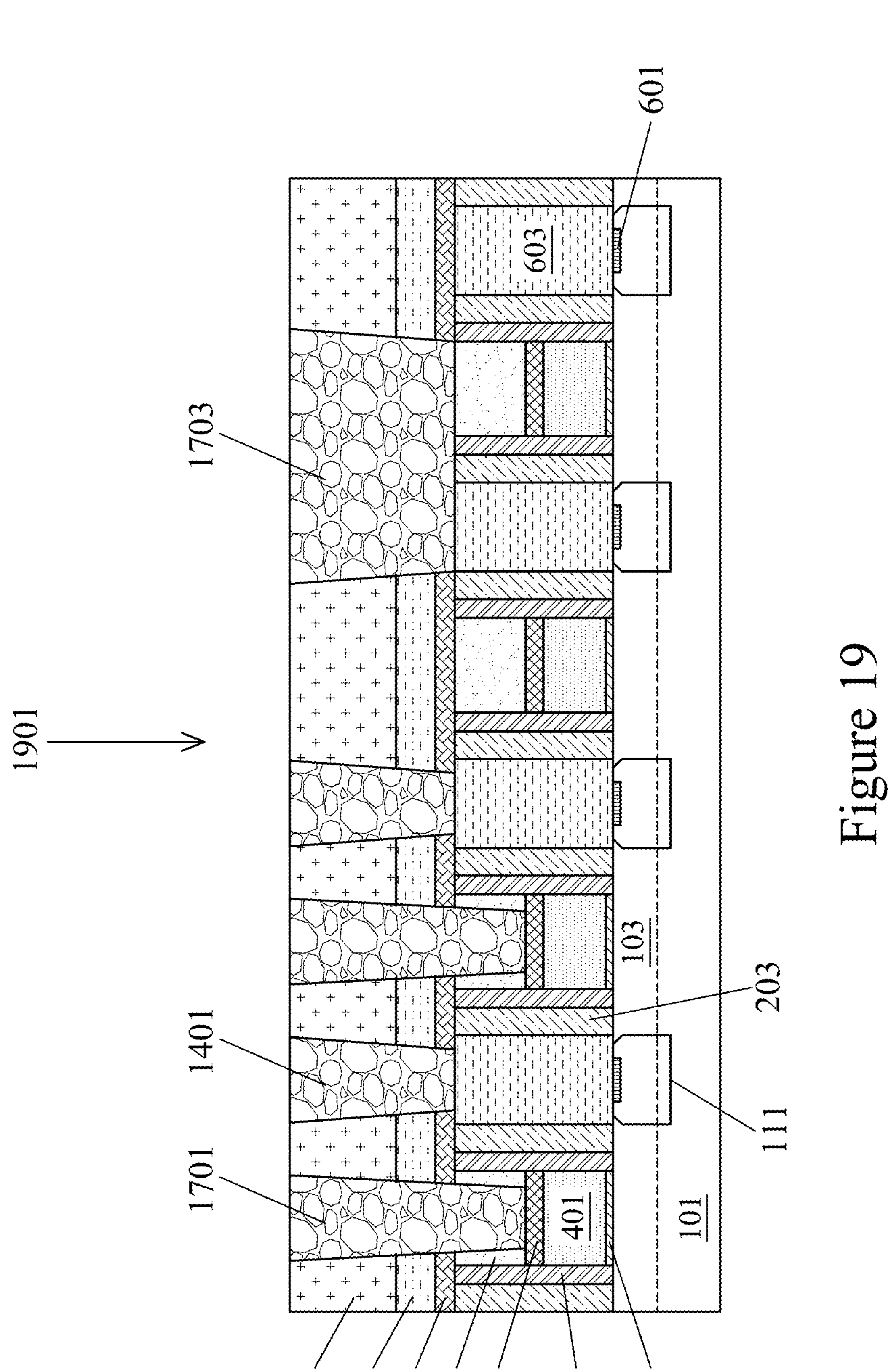
FIG. 19 illustrates a planarization process, in accordance with some embodiments.

FIG. 19 illustrates that, following the formation of gate electrode contacts 1701 and butted contact 1703, a planarization process (represented in FIG. 19 by the arrow labeled 1901) such as a CMP is performed in order to expose a top surface of the source/drain contacts 1401. The planarization process 1901 removes the third ILD 1501 to expose the top surface of the source/drain contacts, along with a portion of gate electrode contacts 1701 and butted contact 1703. The result of planarization process 1901 is a top planar surface in which source/drain contacts 1401, gate electrode contacts 1701 and butted contact 1703 have an exposed conductive surface on the top planar surface. The planarization process 1901 allows for the development of additional features capable of coupling the conductive features as well as providing access points from which to process external connectors to interface with the substrate 101.

Figure 20:
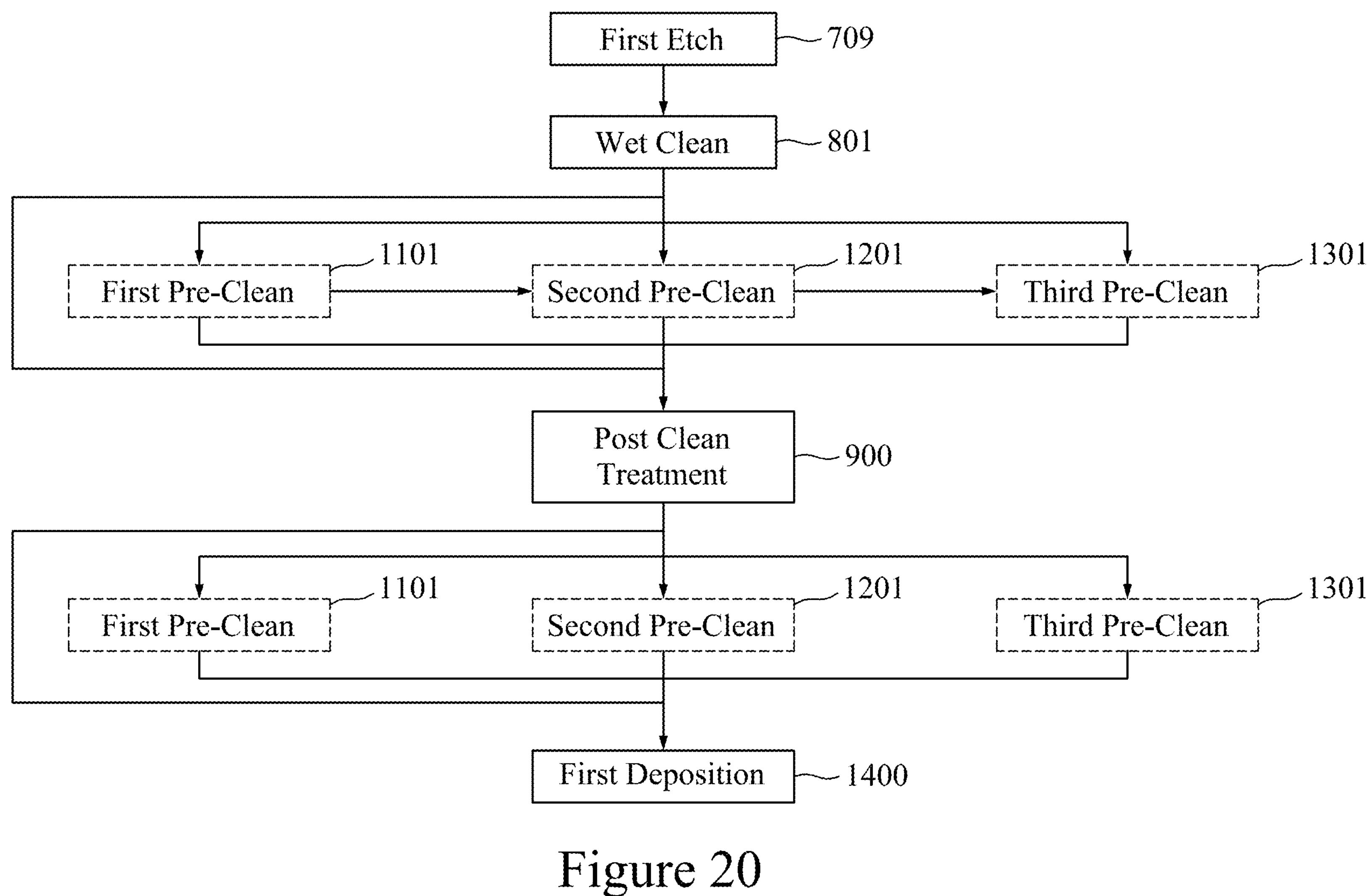
FIG. 20 illustrates a first process flow summary, in accordance with some embodiments.

FIG. 20 illustrates a process flow to summarize the steps in the process described above with respect to FIGS. 7A-14. In this embodiment the first etching process 709 and the wet clean process 801 are initially utilized. After the wet clean process 801, if desired, one or more of the optional first pre-clean process 1101 (with or without the optional inert clean), optional second pre-clean process 1201, and optional third pre-clean process 1301 may be performed, or else the process proceeds to the post-clean treatment 900. Once the post-clean treatment 900 is performed, if desired, one or more of the optional first pre-clean process 1101 (with or without the optional inert clean), optional second pre-clean process 1201, and optional third pre-clean process 1301 may be performed or not, or else the process proceeds to the first deposition process 1400.

Figure 21:
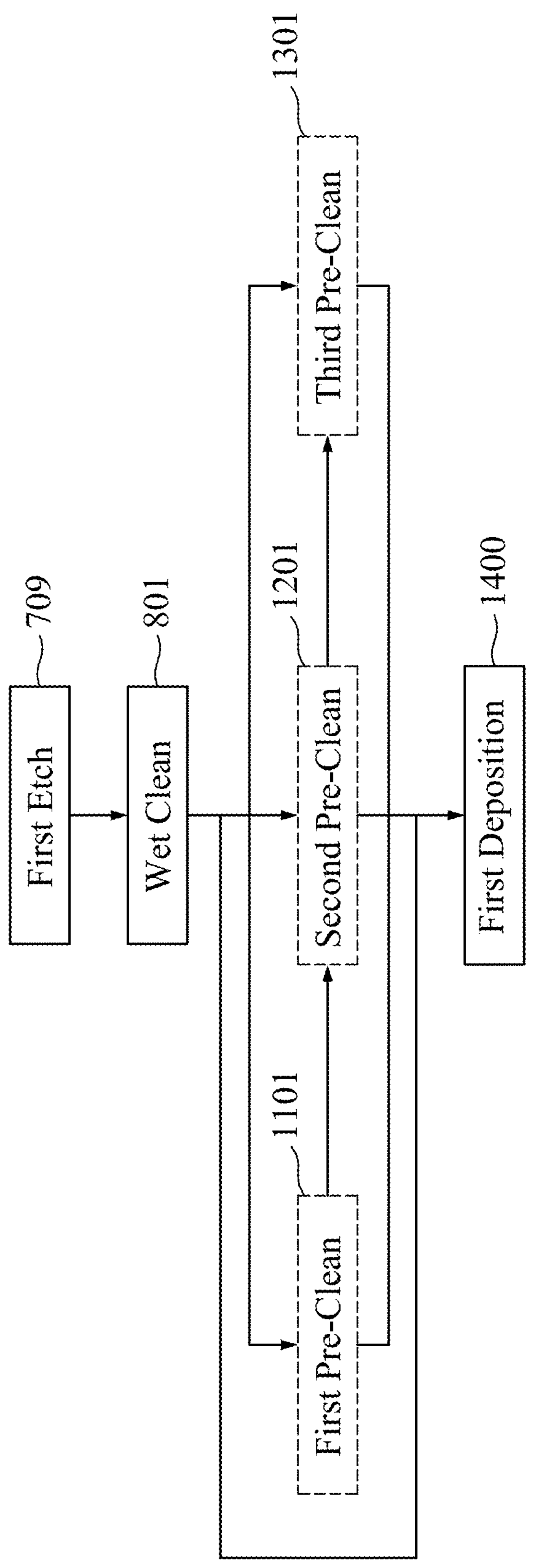
FIG. 21 illustrates a second process flow summary, in accordance with some embodiments.

FIG. 21 illustrates another embodiment of the process flow that may be utilized. In this embodiment, after the first etching process 709 and the wet clean process 801 have been performed, one or more of the optional first pre-clean process 1101 (with or without the optional inert clean), optional second pre-clean process 1201, and optional third pre-clean process 1301 may be performed. However, in this embodiment, instead of performing the post-clean treatment 900 and possibly another round of the optional first pre-clean process 1101 (with or without the optional inert clean), optional second pre-clean process 1201, and optional third pre-clean process 1301, the process may proceed directly to the first deposition process 1400. As such, the sidewalls and bottom of the first openings 707 may still be at least partially repaired while still having a streamlined manufacturing process.

By utilizing the embodiments described herein, multiple types of damage caused by the etching processes to form the first openings 707 may be repaired prior to continuing the manufacturing process. In particular, damage caused to the sidewalls (e.g., dangling bonds) may be repaired so that such damage does not interfere with subsequent deposition processes. Additionally, damage caused along a bottom of the first openings 707 (e.g., formation of an oxide or nitride layer), can be repaired by removing any oxide or nitride layers that have formed. As such, these layers are not present to interfere with the subsequent deposition processes. Such repairing of the damage allows for a more efficient and selective filling of the first openings 707, allowing for a more efficient overall structure.

In an accordance with an embodiment, a method of manufacturing a semiconductor device includes: forming a first opening through a dielectric layer, the first opening exposing a conductive region; wet cleaning the first opening after the forming the first opening; treating the first opening after the wet cleaning the first opening, the treating the first opening comprising turning a sidewall treatment precursor and an bottom treatment precursor into a first plasma mixture, the sidewall treatment precursor being different from the bottom treatment precursor; and filling the first opening with a conductive material after the treating the first opening. In an embodiment the method further includes performing a first pre-clean process separate from the treating the first opening, the first pre-clean process comprising turning the sidewall treatment precursor into a second plasma different from the first plasma mixture. In an embodiment the method further includes performing a second pre-clean process separate from the treating the first opening and also separate from the first pre-clean process, the second pre-clean process comprising turning the bottom treatment precursor into a third plasma different from the first plasma mixture and different from the second plasma. In an embodiment the performing the first pre-clean process and the second pre-clean process are performed after the treating the first opening. In an embodiment the performing the first pre-clean process and the second pre-clean process are performed prior to the treating the first opening. In an embodiment the sidewall treatment precursor comprises diatomic oxygen. In an embodiment the bottom treatment precursor comprises diatomic hydrogen.

In accordance with another embodiment, a method of manufacturing a semiconductor device includes: depositing a plurality of dielectric layers over a conductive material over a semiconductor substrate; etching the plurality of dielectric layers to expose the conductive material, the etching also forming by-products within a first opening; removing the by-products from the first opening, wherein after the etching and after the removing the by-products a sidewall of the first opening is damaged and an oxide layer has been formed from a portion of the conductive material; generating a first plasma from diatomic hydrogen and diatomic oxygen; and repairing the sidewall and removing the oxide layer with the first plasma. In an embodiment the sidewall of the first opening is damaged by creating dangling bonds. In an embodiment the first plasma is free from nitrogen. In an embodiment the method further includes repairing the sidewall a second time with a second plasma, the second plasma being formed from the diatomic hydrogen but not the diatomic oxygen. In an embodiment the method further includes repairing the sidewall a third time with a third plasma, the third plasma being formed from the diatomic oxygen but not the diatomic hydrogen. In an embodiment the repairing the sidewall the second time and the repairing the sidewall the third time are performed after the repairing the sidewall and removing the oxide layer with the first plasma. In an embodiment the first plasma is generated in a remote plasma generator.

In accordance with yet another embodiment, a method of manufacturing a semiconductor device includes: forming a tungsten contact to a source/drain region over a semiconductor fin; depositing a first dielectric layer over the source/drain region; depositing a second dielectric layer over the first dielectric layer; depositing a third dielectric layer over the second dielectric layer; etching the first dielectric layer, the second dielectric layer, and the third dielectric layer to expose at least a portion of the tungsten contact; cleaning the first dielectric layer, the second dielectric layer, the third dielectric layer, and the portion of the tungsten contact; and after the cleaning, exposing the first dielectric layer, the second dielectric layer, the third dielectric layer, and the portion of the tungsten contact to a first plasma comprising hydrogen ions and a second plasma comprising oxygen ions. In an embodiment the method further includes exposing the first dielectric layer, the second dielectric layer, the third dielectric layer, and the portion of the tungsten contact to a third plasma comprising hydrogen ions but not oxygen ions. In an embodiment the method further includes exposing the first dielectric layer, the second dielectric layer, the third dielectric layer, and the portion of the tungsten contact to a fourth plasma comprising oxygen ions but not hydrogen ions. In an embodiment the method further includes exposing the first dielectric layer, the second dielectric layer, the third dielectric layer, and the portion of the tungsten contact to a fifth plasma comprising hydrogen ions but not oxygen ions. In an embodiment the exposing to the third plasma occurs after the exposing to the first plasma. In an embodiment the exposing to the third plasma occurs prior to the exposing to the first plasma.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:

wet cleaning a first opening through a dielectric layer, the first opening exposing a conductive region;

treating the first opening with a first plasma mixture, the first plasma mixture simultaneously comprising a first plasma of hydrogen and a second plasma of oxygen;

performing one or more cleaning processes after treating the first opening; and filling the first opening with a conductive material.

2. The method of claim 1, wherein the one or more cleaning processes comprises a first cleaning process which uses the first plasma without the second plasma.

3. The method of claim 2, wherein the one or more cleaning processes comprises a second cleaning process which uses the second plasma without the first plasma.

4. The method of claim 3, wherein the one or more cleaning processes comprises a third cleaning different from the first cleaning process, wherein the third cleaning process uses the first plasma without the second plasma.

5. The method of claim 1, wherein the conductive region comprises tungsten.

6. The method of claim 5, wherein the treating the first opening removes tungsten oxide.

7. The method of claim 1, wherein the treating the first opening repairs dangling bonds along sidewalls of the first opening.

8. A method of manufacturing a semiconductor device, the method comprising:

cleaning a first opening through a dielectric layer, the first opening exposing a conductive region, wherein after the cleaning a first by-product is present along sidewalls of the opening and a second by-product different from the first by-product is present along a bottom of the opening;

removing the first by-product and the second by-product with a first plasma mixture, wherein the first plasma mixture simultaneously comprises a first plasma to remove the first by-product and a second plasma to remove the second by-product; and performing one or more cleaning processes after the treating the first opening;

filling the first opening with a conductive material.

9. The method of claim 8, wherein the first plasma is generated from hydrogen.

10. The method of claim 9, wherein the second plasma is generated from oxygen.

11. The method of claim 10, wherein the removing is performed at least in part at a temperature of between about 100° C. and about 400° C.

12. The method of claim 11, wherein the removing is performed at least in part at a pressure of between about 0.5 Torr and about 6 Torr.

13. The method of claim 8, wherein the removing is performed at least for a time of between about 30 seconds and about 600 seconds.

14. The method of claim 8, wherein the removing the second by-product removes tungsten oxide.

15. A method of manufacturing a semiconductor device, the method comprising:

wet cleaning a first opening through a dielectric layer, the first opening exposing a conductive region;

performing one or more cleaning processes a first time after the wet cleaning;

after the performing the one or more cleaning processes, treating the first opening with a first plasma mixture simultaneously comprising a first plasma to treat sidewalls of the first opening and a second plasma to treat a bottom of the first opening, the first plasma being different from the second plasma;

performing the one or more cleaning processes a second time after the treating the first opening; and filling the first opening with a conductive material.

16. The method of claim 15, wherein during the treating the first opening the first time there is a flow ratio of oxygen to hydrogen of between about 5% to about 95%.

17. The method of claim 15, wherein the treating the first opening the first time is performed in a nitrogen free atmosphere.

18. The method of claim 15, wherein the treating the first opening the first time is performed in an inert gas free atmosphere.

19. The method of claim 15, wherein the treating removes SiOF from the sidewalls of the first opening.

20. The method of claim 15, wherein the treating removes SiON from the sidewalls of the first opening.

* * * * *